(12) United States Patent
Sato

(10) Patent No.: US 8,923,077 B2
(45) Date of Patent: Dec. 30, 2014

(54) SEMICONDUCTOR DEVICE OPERATES ON EXTERNAL AND INTERNAL POWER SUPPLY VOLTAGES AND DATA PROCESSING SYSTEM INCLUDING THE SAME

(75) Inventor: Takenori Sato, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 299 days.

(21) Appl. No.: 13/614,845

(22) Filed: Sep. 13, 2012

(65) Prior Publication Data

US 2013/0070537 A1 Mar. 21, 2013

(30) Foreign Application Priority Data

Sep. 21, 2011 (JP) ................................ 2011-205738

(51) Int. Cl.
*G11C 7/00* (2006.01)
*G11C 7/10* (2006.01)

(52) U.S. Cl.
CPC .................................. *G11C 7/1057* (2013.01)
USPC ............ 365/189.11; 365/189.02; 365/189.05; 365/191; 365/193; 326/63; 326/80; 326/81; 327/333

(58) Field of Classification Search
USPC .......... 365/189.11, 189.02, 189.05, 191, 193; 326/63, 80, 81; 327/333
See application file for complete search history.

(56) References Cited

U.S. PATENT DOCUMENTS

| | | | |
|---|---|---|---|
| 2006/0002222 A1 | 1/2006 | Lee | |
| 2006/0261851 A1* | 11/2006 | Kim | 326/81 |
| 2009/0085639 A1* | 4/2009 | Ueno | 327/333 |
| 2009/0091349 A1 | 4/2009 | Bhakta et al. | |
| 2009/0154257 A1 | 6/2009 | Fujioka et al. | |
| 2010/0054035 A1 | 3/2010 | Dono et al. | |
| 2010/0117709 A1* | 5/2010 | Vlasenko | 327/333 |
| 2011/0062998 A1* | 3/2011 | Mitsubori et al. | 327/152 |
| 2011/0249521 A1* | 10/2011 | Abe | 365/193 |

FOREIGN PATENT DOCUMENTS

| | | |
|---|---|---|
| JP | 2011-60353 | 3/2011 |
| JP | 2011-60385 | 3/2011 |

* cited by examiner

*Primary Examiner* — Toan Le

(57) ABSTRACT

The semiconductor device including an output terminal; and an output unit coupled to the output terminal. The output unit includes an output buffer coupled to the output terminal and operating on a first power supply voltage, a first control circuit operating on a second power supply voltage, receiving an impedance adjustment signal and a data signal and making the output buffer drive the output terminal to a first logic level designated by the data signal with impedance designated by the impedance adjustment signal, and a level shifter coupled between the output buffer and the first control circuit. The second power supply voltage is smaller in level than the first power supply voltage. The level shifter includes a first circuit portion operating on the second power supply voltage and a second circuit portion operating on the first power supply voltage.

20 Claims, 14 Drawing Sheets

SEMICONDUCTOR DEVICE OPERATES ON EXTERNAL AND INTERNAL POWER SUPPLY VOLTAGES AND DATA PROCESSING SYSTEM INCLUDING THE SAME

BACKGROUND OF THE INVENTION

1. Field of the Invention

The present invention relates to a semiconductor device, and particularly to a semiconductor device that controls output timing of data using a latency counter. The present invention also relates to a data processing system including such a semiconductor device.

2. Description of Related Art

Synchronous memory devices represented by a synchronous DRAM (Synchronous Dynamic Random Access Memory) are widely used as a main memory or the like of personal computers. In the synchronous memory device, data is inputted and outputted in synchronism with a clock signal supplied from a controller. Thus, when a higher-speed clock signal is used, the data transfer rate can be increased.

However, because a DRAM core is consistently operated by an analog operation also in the synchronous DRAM, a considerably weak charge needs to be amplified by a sensing operation. Accordingly, it is not possible to shorten the time from issuing a read command to outputting first data. After the elapse of a predetermined delay time from the read command is issued, the first data is outputted in synchronism with an external clock signal.

This delay time is generally called "CAS latency" and is set to an integral multiple of a clock cycle. For example, when the CAS latency is 5 (CL=5), the read command is fetched in synchronism with the external clock signal, and thereafter, the first data is outputted in synchronism with the external clock signal that is after five cycles. That is, the first data is outputted after the elapse of the five clock cycles. A counter that counts such latency is referred to as a "latency counter".

Desired CAS latency is realized by the latency counter. The latency counter is a circuit that receives an internal read command MDRDT from a command decoder, and generates an internal read command DRC by delaying the command MDRDT by a period of time corresponding to the CAS latency. More specifically, the latency counter first generates an output gate signal COT, which is in synchronism with an internal clock signal LCLK supplied from a DLL circuit (phase synchronizing circuit); and an input gate signal CIT, which is generated by delaying the output gate signal COT. The output gate signal COT and the input gate signal CIT, respectively, are made up of eight-line signals; and are so configured that each line is sequentially activated for each clock cycle. When the internal read command MDRDT is supplied, the latency counter accepts the internal read command MDRDT in synchronism with the activated line signal of input gate signal CIT. Each line signal of the input gate signal CIT is associated in advance with each line signal of the output gate signal COT on a one-to-one basis. The latency counter waits until the next activation of the line signal of the output gate signal COT corresponding to the input gate signal CIT that is used to accept the internal read command MDRDT takes place. Then, in response to the activation of the output gate signal COT, the latency counter starts activating the internal read command DRC. The CAS latency is realized by the waiting period during the above process. An output circuit outputs read data to the outside in synchronization with the internal read command DRC that has become activated as described above. An example of the latency counter is disclosed in Japanese Patent Application Laid-Open No. 2011-60353.

As for a semiconductor device including a synchronous memory device, there is a semiconductor device that uses, as power source used for operating some circuits, an internal voltage that is generated by lowering an external voltage, thereby reducing power consumption. For example, there is disclosed in Japanese Patent Application Laid-Open No. 2011-60385 an example in which an internal voltage WERT is generated from an external voltage VDD and an external voltage VSS to operate some peripheral circuits of DRAM.

However, when the internal voltage is used in a semiconductor device that uses a latency counter, there is a possibility that the margin (or latch margin of the latency counter) decreases at a time when the internal read command MDRDT is accepted in synchronism with the input gate signal CIT, and the process of accepting the internal read command MDRDT could fail as a result. The mechanism will be described below in detail.

As described above, the internal clock signal LCLK is generated by a DLL circuit. The DLL circuit is so formed as to contain a feedback circuit, which is so adjusted as to cause a delay amount equivalent to that of the output circuit, and a control circuit, which adjusts the internal clock signal LCLK in such a way that the output timing of the feedback circuit is in synchronism with an internal clock signal PreCLK, which is described later. Therefore, the phase of the internal clock signal LCLK varies according to the delay time of the feedback circuit.

Meanwhile, the internal read command MDRDT is generated by a command decoder. The command decoder receives a read command READ supplied from a command input circuit, which receives the read command READ; generates an internal read command MDRDT based on the read command READ; and then outputs the internal read command MDRDT in synchronism with an internal clock signal ICK, which is described below.

The internal clock signal PreCLK and the internal clock signal ICK, respectively, are generated as described below. That is, a clock input circuit that receives an external clock signal generates the internal clock signal PreCLK based on the external clock signal. To the DLL circuit, the internal clock signal PreCLK is supplied. The internal clock signal PreCLK is also supplied to a timing generation circuit, where the internal clock signal PreCLK is converted to an internal clock signal ICK. To the command decoder, the internal clock signal ICK is supplied.

When the internal voltage is used, among the circuits that have so far been described, the DLL circuit, the command decoder, the timing generation circuit, and the latency counter are so formed as to operate only on the internal voltage in principle in order to reduce power consumption.

By contrast, the clock input circuit and the command input circuit are so formed as to contain a circuit that operates on external voltage even when the internal voltage is used. The reason is that a signal whose amplitude value is equal to that of the external voltage is accepted from the outside. The feedback circuit in the DLL circuit also contains, as an exception, a circuit that operates on external voltage. The reason is that an output circuit that outputs read data to the outside inevitably contains a circuit that operates on external voltage.

Here, suppose that a change in external voltage has occurred. Then, a change in phase occurs at least in the following signals among the clock signals that have so far been described: the internal clock signal PreCLK and the internal clock signal LCLK. The reason is that the clock input circuit and the DLL circuit, which are used to generate the internal clock signal PreCLK and the internal clock signal LCLK, contain a circuit that operates on external voltage.

The internal clock signal PreCLK is common to the internal read command MDRDT and the input gate signal CIT. Therefore, even when a change in phase occurs, there is no effect at least on the latch margin of the latency counter. By contrast, if a change in phase of the internal clock signal LCLK occurs, a change in phase occurs only in the input gate signal CIT, and no change in phase in the internal read command MDRDT. As a result, a difference in phase occurs between the internal read command MDRDT and the input gate signal CIT, leading to a decline in the latch margin of the latency counter.

As described above, when a change in external voltage occurs, a change in phase of the input gate signal CIT occurs while the internal read command MDRDT does not change. As a result, the latch margin of the latency counter decreases. In some cases, the process of accepting the internal read command MDRDT could fail. Therefore, a technology for curbing a decline in the latch margin that is associated with a change in external voltage is desired.

SUMMARY

In an aspect of this disclosure, there is provided a device comprising: an output terminal; and an output unit coupled to the output terminal, the output unit comprising; an output buffer coupled to the output terminal and operating on a first power supply voltage, a first control circuit operating on a second power supply voltage, receiving an impedance adjustment signal and a data signal and making the output buffer drive the output terminal to a first logic level designated by the data signal with impedance designated by the impedance adjustment signal, the second power supply voltage being smaller in level than the first power supply voltage; and a level shifter coupled between the output buffer and the first control circuit, the level shifter including a first circuit portion operating on the second power supply voltage and a second circuit portion operating on the first power supply voltage.

Another aspect of the disclosure, there is provided an output terminal, an output buffer including a power supply node supplied with a first power supply voltage and a plurality of transistors coupled in parallel between the power supply node and the output terminal; a first control circuit operating on a second power supply voltage, receiving an impedance adjustment signal and a data signal and making one or ones of the transistors, that designated by the impedance adjustment signal, conductive to drive the output terminal to a first logic level designated by the data signal, the second power supply voltage being smaller in level than the first power supply voltage; and a plurality of level shift circuits each coupled between the first control circuit and a control electrode of an associated one of the transistors, each of the level shift circuits including a first circuit portion operating on the second power supply voltage and a second circuit portion operating on the first power supply voltage.

DETAILED DESCRIPTION OF THE EMBODIMENTS

Preferred embodiments of the present invention will be explained below in detail with reference to the accompanying drawings.

Figure 1:
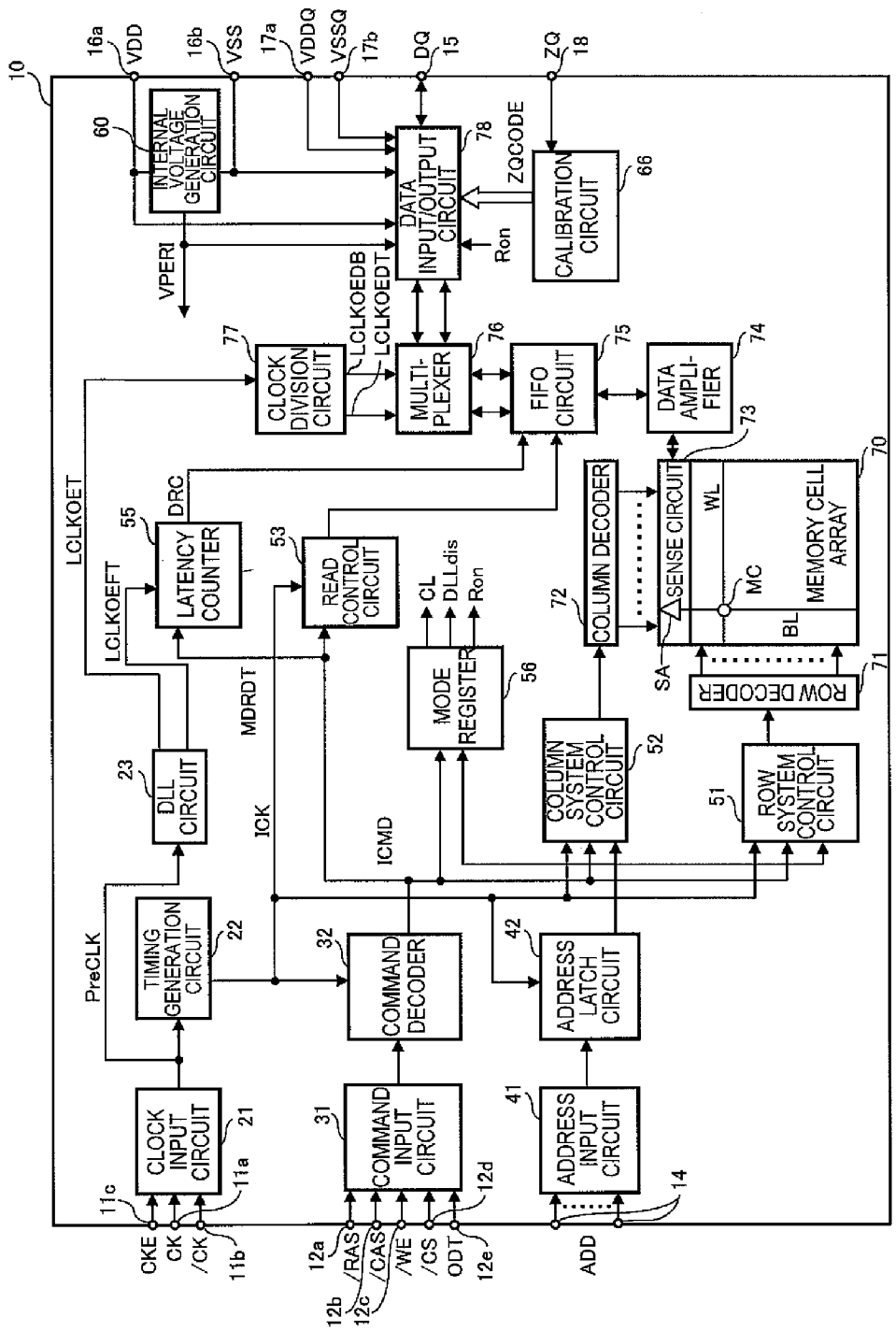
FIG. 1 is a block diagram showing the overall configuration of a semiconductor device 10 according to a preferred embodiment of the present invention.

Referring now to FIG. 1, the semiconductor device 10 of the present embodiment is a synchronous DRAM, and includes the following external terminals: clock terminals 11a and 11b; a clock enable terminal 11c; command terminals 12a to 12e; address terminals 14; a data input/output terminal 15; power supply terminals 16a, 16b, 17a, and 17b; and a calibration terminal 18.

The clock terminals 11a and 11b are terminals to which external clock signals CK and /CK are respectively supplied. The clock enable terminal 11c is a terminal to which a clock enable signal CKE is input. The supplied external clock signals CK and /CK and clock enable signal CKE are supplied to a clock input circuit 21. In the present specification, a signal whose name starts with "/" means an inverted signal of a corresponding signal, or a low-active signal. Accordingly, the clock signals CK and /CK are complementary to each other. An input clock signal PreCLK, which is output from the clock input circuit 21, is supplied to a timing generation circuit 22 and a DLL circuit 23 (phase synchronizing circuit). The timing generation circuit 22 plays a role of generating an internal clock signal ICK based on the internal clock signal PreCLK and supplying the internal clock signal ICK to various internal circuits except circuits of a data output system. The DLL circuit 23 plays a role of generating an internal clock signal LCLKOET (first internal clock signal) and an internal clock signal LCLKOEFT (second internal clock signal), and supplying the internal clock signal LCLKOET to each circuit of the data output system, and the internal clock signal LCLKOEFT to a latency counter 55. Incidentally, the internal clock signal LCLKOEFT is a signal that is output by splitting the internal clock signal LCLKOET inside the DLL circuit 23, and thus the internal clock signal LCLKOEFT is the same signal as the internal clock signal LCLKOET in principle. However, a delay circuit may be provided inside the DLL circuit 23 so that the internal clock signal LCLKOEFT lags slightly behind the internal clock signal LCLKOET.

The DLL circuit 23 has a function of controlling the phase of the internal clock signal LCLKOET based on the clock signals CK and /CK. More specifically, the DLL circuit 23 controls the phase of the internal clock signal LCLKOET so that the phase of read data DQ which a data input/output circuit 78 described later outputs from the data input/output terminal 15 in synchronization with the internal clock signal LCLKOET is aligned with the phase of the clock signals CK and /CK at the data input/output terminal 15. The DLL circuit 23 will be described later in more detail.

Incidentally, the DLL circuit 23 is not necessarily used constantly. Whether or not the DLL circuit 23 is used is selected depending on what is set in a mode register 56. That is, when "DLL ON mode" is set in the mode register 56, the DLL circuit 23 is used; the phase control of the internal clock signal LCLKOET is performed relative to the clock signals CK and /CK. When "DLL OFF mode" is set in the mode register 56, the DLL circuit 23 is not used; the phase control of the internal clock signal LCLKOET is not performed relative to the clock signals CK and /CK. The mode register 56 controls the DLL circuit 23 through a mode signal DLLdis.

The command terminals 12a to 12e are terminals to which the following signals are respectively supplied: a row address strobe signal /RAS; a column address strobe signal /CAS; a write enable signal /WE; a chip select signal /CS; and an on-die termination signal ODT. The above command signals are supplied to a command decoder 32 via a command input circuit 31. The command decoder 32 is a circuit that generates various internal commands ICMD by retaining, decoding, and counting command signals, or by performing other operations. The generated internal commands ICMD are signals that are in synchronization with the internal clock ICK. If a command signal is a signal that is recognized as a read command READ, the command decoder 32 generates, an internal read command MDRDT (first internal read command) as an internal command ICMD.

The internal commands ICMD generated by the command decoder 32 are supplied to a row system control circuit 51, a column system control circuit 52, a read control circuit 53, the latency counter 55, the mode register 56, and the like. Among various internal commands ICMD, the internal read command MDRDT is supplied at least to the latency counter 55 and the read control circuit 53.

The latency counter 55 is a circuit that generates an internal read command DRC (second internal read command) by delaying the internal read command MDRDT. The amount of delay is so determined as to allow read data DQ to be output after CAS latency CL, which is set in advance in the mode register 56, has passed since the read command READ is supplied to the command input circuit 31. In this case, while the internal read command MDRDT is in synchronization with the internal clock ICK, the internal read command DRC, which is output from the latency counter 55, needs to be in synchronization with the internal clock signal LCLKOET. For this, the latency counter 55 outputs the internal read command DRC in synchronization with the internal clock signal LCLKOEFT. That is, the latency counter 55 also plays a role of switching the clock that is to be synchronized with the internal read command MDRDT from the internal clock ICK to the internal clock signal LCLKOEFT. The latency counter 55 will be described later in more detail.

The address terminals 14 are terminals to which address signals ADD are supplied. The address signals ADD supplied to the address terminals 14 are supplied to an address latch circuit 42 via an address input circuit 41. The address latch circuit 42 is a circuit that latches address signals ADD in synchronization with the internal clock ICK.

The address signals ADD usually are signals for specifying one or a plurality of memory cells in a memory cell array 70. In the memory cell array 70, a plurality of word lines WL and a plurality of bit lines BL cross each other; at the intersection points thereof, memory cells MC are disposed. In a sense circuit 73, which is disposed next to the memory cell array 70, sense amplifiers SA are provided for each bit line BL; a plurality of bit lines BL, respectively, are connected to the corresponding sense amplifiers SA in the sense circuit 73. Incidentally, FIG. 1 only shows one word line WL, one bit line BL, one sense amplifier SA, and one memory cell MC. The address signals ADD are so formed as to contain a row address, which specifies a word line WL, and a column address, which specifies a bit line BL (sense amplifier SA). Among the address signals ADD latched by the address latch circuit 42, the row address is supplied to the row system control circuit 51, and the column address to the column system control circuit 52.

The address signals ADD at a time when an entry has been made in the mode register set turn out to be signals that represent a predetermined kind of information corresponding to a command signal that is input during the same period, and does not represent a memory cell. In this case, the address signals ADD latched by the address latch circuit 42 are supplied to the mode register 56.

The row system control circuit 51 is a circuit that supplies a row address to a row decoder 71. The row system control circuit 51 stores a row address indicating a defective word line and a row address indicating a redundant word line in such a way that the row addresses are associated with each other. When a row address is supplied from the address latch circuit 42, the row system control circuit 51 makes a determination as to whether or not the row address supplied is the same as the row address stored indicating a defective word line. If it is determined that the row addresses are not the same, the row system control circuit 51 supplies the row address supplied from the address latch circuit 42 to the row decoder 71 as is. If it is determined that the row addresses are the same, the row system control circuit 51 supplies a row address indicating a redundant word line that is so stored as to be associated with the row address supplied from the address latch circuit 42 to the row decoder 71.

The row decoder 71 is a circuit that selects, from among a plurality of word lines WL in the memory cell array 70, a word line WL corresponding to a row address supplied from the row system control circuit 51.

The column system control circuit 52 is a circuit that supplies a column address to a column decoder 72. The column system control circuit 52 stores a column address indicating a defective bit line and a column address indicating a redundant bit line in such a way that the column addresses are associated with each other. When a column address is supplied from the address latch circuit 42, the column system control circuit 52 makes a determination as to whether or not the column address supplied is the same as the column address stored indicating a defective bit line. If it is determined that the column addresses are not the same, the column system control circuit 52 supplies the column address supplied from the address latch circuit 42 to the column decoder 72 as is. If it is determined that the column addresses are the same, the column system control circuit 52 supplies a column address indicating a redundant bit line that is so stored as to be associated with the column address supplied from the address latch circuit 42 to the column decoder 72.

The column decoder 72 is a circuit that selects a sense amplifier SA connected to a bit line BL corresponding to a column address supplied from the column system control circuit 52, among a plurality of bit lines BL in the memory cell array 70. The sense amplifier SA selected by the column decoder 72 is then connected to a data amplifier 74.

The data input/output terminal 15 is a terminal used for outputting read data DQ and inputting write data DQ, and is connected to a data input/output circuit 78. The data input/output circuit 78 is connected to the data amplifier 74 via a multiplexer 76 and a FIFO circuit 75. In a read operation, a plurality of read data sets DQ prefetched from the memory cell array 70 to the FIFO circuit 75 are output in burst mode from the data input/output terminal 15 via the multiplexer 76 and the data input/output circuit 78. In a write operation, a plurality of write data sets DQ, which are input in burst mode to the data input/output terminal 15, are prefetched to the FIFO circuit 75 via the data input/output circuit 78 and the multiplexer 76, and then written to the memory cell array 70 at the same time.

The impedance of the data input/output circuit 78 is set in advance in the mode register 56. The set value is supplied, as an impedance setting code Ron, from the mode register 56 to the data input/output circuit 78. While details will be described later, the data input/output circuit 78 includes a function of adjusting the impedance of itself in accordance with the impedance setting code Ron. The data input/output circuit 78, too, will be described later in more detail.

An operation of the FIFO circuit 75 at the time of reading is controlled by the read control circuit 53. The read control circuit 53 is a circuit that instructs the FIFO circuit 75 to output read data DQ in synchronization with the internal clock signal ICK in response to the internal read command MDRDT supplied from the command decoder 32. To the FIFO circuit 75, the internal read command DRC generated by the latency counter 55, too, is supplied. After being instructed by the read control circuit 53 to output read data DQ, the FIFO circuit 75 starts outputting read data DQ in synchronization with the internal read command DRC.

The multiplexer 76 is so formed as to operate in synchronization with the complementary internal clock signals LCLKOEDT and LCLKOEDB that are supplied from a clock division circuit 77. The clock division circuit 77 is a circuit that receives the internal clock signal LCLKOET supplied from the DLL circuit 23, and generates the complementary internal clock signals LCLKOEDT and LCLKOEDB based on the internal clock signal LCLKOET.

The power supply terminals 16a and 16b are terminals to which an external voltage VDD (first power supply voltage) and an external voltage VSS are respectively supplied; and are connected to an internal voltage generation circuit 60 and the data input/output circuit 78. The internal voltage generation circuit 60 is a circuit that generates an internal voltage VPERI (second power supply voltage) and other various internal voltages from the external voltages VDD and VSS. The internal voltage VPERI is lower than the external voltage VDD.

The power supply terminals 17a and 17b are terminals to which an external voltage VDDQ and an external voltage VSSQ are respectively supplied; and are connected to the data input/output circuit 78. The potential of the external voltage VDDQ and the potential of the external voltage VSSQ are equal to the potential of the external voltage VDD and the potential of the external voltage VSS, respectively. The external voltage VDDQ and the external voltage VSSQ are supplied besides the external voltage VDD and the external voltage VSS in order to prevent noise from spreading via power supply lines.

In the semiconductor device 10, at least the timing generation circuit 22, the DLL circuit 23, the latency counter 55, the clock division circuit 77, the multiplexer 76, and the command decoder 32 are so formed as to operate on the internal voltage VPERI; the above components do not include circuits that operate on the external voltages VDD and VDDQ. In this manner, instead of the relatively high external voltage VDD, the relatively low internal voltage VPERI is used, thereby achieving a reduction in power consumption. Meanwhile, at least the data input/output circuit 78 is so formed as to contain both a circuit (first circuit) that operates on the internal voltage VPERI and a circuit (second circuit) that operates on the external voltages VDD and VDDQ. The reason is that the amplitude value of read data DQ output from the data input/output terminal 15 needs to be equal to that of the external voltage VDD. Between the first and second circuits, a level shift circuit is inserted to convert the amplitude value of a signal. The details will be described later.

The calibration terminal 18 is a terminal to which an external resistor for calibration (not shown) is connected; and is connected to a calibration circuit 66. The calibration circuit 66 includes a replica buffer having the same circuit configuration as a unit buffer in the data input/output circuit 78, which is described later. The impedance of one unit buffer is preset, for example, to 240Ω. However, the impedance could vary slightly according to changes in outside temperature, power supply voltage, and other factors. The calibration circuit 66 is a circuit that generates an impedance code ZQCODE to cancel the variation, and supplies the impedance code ZQCODE to the data input/output circuit 78.

The external resistor (not shown) connected to the calibration terminal 18 is a resistor that has the same impedance as the designed value (for example 240Ω) of the impedance of a unit buffer. The calibration circuit 66 performs an operation (calibration operation) of matching the resistance value of the external resistor and the impedance of the replica buffer, thereby generating an impedance code ZQCODE.

The above has described the overall configuration of the semiconductor device 10 according to the present embodiment. The present embodiment is characterized by the internal configurations of the data input/output circuit 78 and the DLL circuit 23. Thus, hereinafter, first the internal configurations of the data input/output circuit 78 and the DLL circuit 23 will be described, and the characteristic configuration of the present embodiment will also be described in detail. The advantageous effects achieved by the present embodiment are as follows: a decline in the latch margin of the latency counter 55, which is caused by a change in the external voltage VDD, is curbed (First advantageous effect); and the accurate internal clock signal LCLKOET can be obtained even if the DLL circuit 23 includes no circuit that operates on the external voltage VDD (Second advantageous effect). The second advantageous effect is explained in detail when the internal configuration of the DLL circuit 23 is described. The first advantageous effect is explained in detail when the configuration of the latency counter 55 is described with reference to an operation waveform diagram, which shows an operation thereof, after the characteristic configuration of the present embodiment is described.

Figure 2:
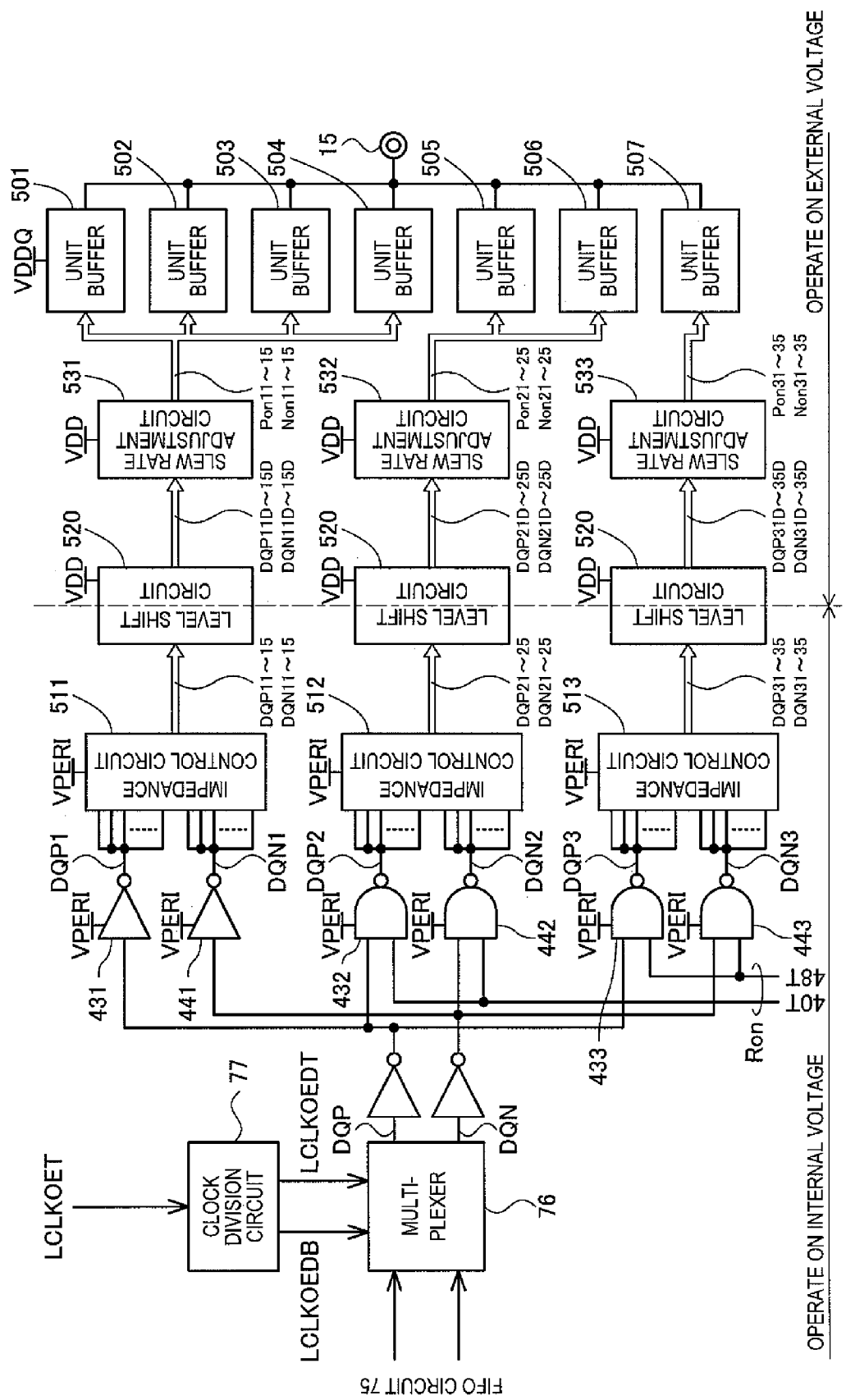
FIG. 2 is a block diagram showing the configuration of the data input/output circuit 78 (output circuit) as well as the clock division circuit 77 and the multiplexer 76.

As shown in FIG. 2, the data input/output circuit 78 includes inverters 431 and 441; NAND gate circuits 432, 433, 442, and 443; impedance control circuits 511 to 513; level shift circuits 520; slew rate adjustment circuits 531 to 533; and unit buffers 501 to 507 (buffer circuits).

The multiplexer 76 is a circuit that receives complementary internal clock signals LCLKOEDT and LCLKOEDB supplied from the clock division circuit 77, and generates pull-up data DQP and pull-down data DQN from the read data DQ supplied from the FIFO circuit 75. The pull-up data DQP and the pull-down data DQN are signals that are in phase with each other. As described above, the multiplexer 76 is so formed as to operate on the internal voltage VPERI. Therefore, the amplitude values of the pull-up data DQP and pull-down data DQN are equal to that of the internal voltage VPERI.

The circuits in the data input/output circuit 78 are divided into three groups: the first group includes the inverters 431 and 441, the impedance control circuit 511, the slew rate adjustment circuit 531, and the unit buffers 501 to 504; the second group includes the NAND gate circuits 432 and 442, the impedance control circuit 512, the slew rate adjustment circuit 532, and the unit buffers 505 and 506; the third group includes the NAND gate circuits 433 and 443, the impedance control circuit 513, the slew rate adjustment circuit 533, and the unit buffer 507.

The second and third groups are so formed as to be disabled independently of each other in response to an impedance setting code Ron supplied from the mode register 56. The first group is always enabled. The unit buffers 501 to 507 are so designed as to have the same impedance (e.g. 240Ω), and are commonly connected to the data input/output terminal 15. Accordingly, by enabling or disabling one or a plurality of groups, it is possible to adjust the impedance of the semiconductor device 10 when seen from an external controller connected to the data input/output terminal 15. In order to explain a specific example, suppose that the impedance of each unit buffer is 240Ω. If both the second and third groups are disabled, the impedance is 60Ω(=240 Ω/4). If the second group is enabled, and the third group disabled, the impedance is 40Ω(=240Ω/6). If the third group is enabled, and the second group disabled, the impedance is 48Ω(=240Ω/5). If both the second and third groups are enabled, the impedance is 34.3Ω (≈240Ω/7).

As shown in FIG. 2, the impedance setting code Ron is so formed as to contain a first setting bit 40T and a second setting bit 48T. The first setting bit 40T is supplied to the NAND gate circuits 432 and 442, which belong to the second group. The second setting bit 48T is supplied to the NAND gate circuits 433 and 443, which belong to the third group.

Furthermore, to the NAND gate circuits 432 and 442, which belong to the second group, an inverted signal of pull-up data DQP and an inverted signal of pull-down data DQN are also respectively supplied. Accordingly, when the first setting bit 40T is at a high level, i.e. when the second group has been enabled, pull-up data DQP2 output from the NAND gate circuit 432 are the same values as the pull-up data DQP, and pull-down data DQN2 output from the NAND gate circuit 442 are the same values as the pull-down data DQN. When the first setting bit 40T is at a low level, i.e. when the second group has been disabled, the pull-up data DQP2 and the pull-down data DQN2 both are fixed to a high level.

Similarly, to the NAND gate circuits 432 and 442, which belong to the third group, an inverted signal of pull-up data DQP and an inverted signal of pull-down data DQN are also respectively supplied. Accordingly, when the second setting bit 48T is at a high level, i.e. when the third group has been enabled, pull-up data DQP3 output from the NAND gate circuit 433 are the same values as the pull-up data DQP, and pull-down data DQN3 output from the NAND gate circuit 443 are the same values as the pull-down data DQN. When the second setting bit 48T is at a low level, i.e. when the third group has been disabled, the pull-up data DQP3 and the pull-down data DQN3 both are fixed to a high level.

To the inverters 431 and 441, which belong to the first group, only an inverted signal of pull-up data DQP and an inverted signal of pull-down data DQN are respectively supplied; no impedance setting code Ron is supplied. Therefore, pull-up data DQP1 output from the inverter 431 always have the same values as the pull-up data DQP, and pull-down data DQN1 output from the inverter 441 always have the same values as the pull-down data DQN. That is, the first group is always enabled.

The pull-up data DQP1 and the pull-down data DQN1 are supplied to the impedance control circuit 511. Similarly, the pull-up data DQP2 and the pull-down data DQN2 are supplied to the impedance control circuit 512. The pull-up data DQP3 and the pull-down data DQN3 are supplied to the impedance control circuit 513.

The impedance control circuits 511 to 513 have a function of adjusting the impedance of a unit buffer in a group that the impedance control circuits 511 to 513 each belong to in such a way that the impedance of the unit buffer becomes equal to a designed value (e.g. 240Ω). Because of the function, for example, even when there is a change in outside temperature or power supply voltage, the impedance of each unit buffer can be brought to the designed value. Hereinafter, the configuration of the impedance control circuit 511 will be described in detail. Even though the impedance control circuits 512 and 513 will not be described in detail, the configurations of the impedance control circuits 512 and 513 are the same as that of the impedance control circuit 511.

Figure 3:
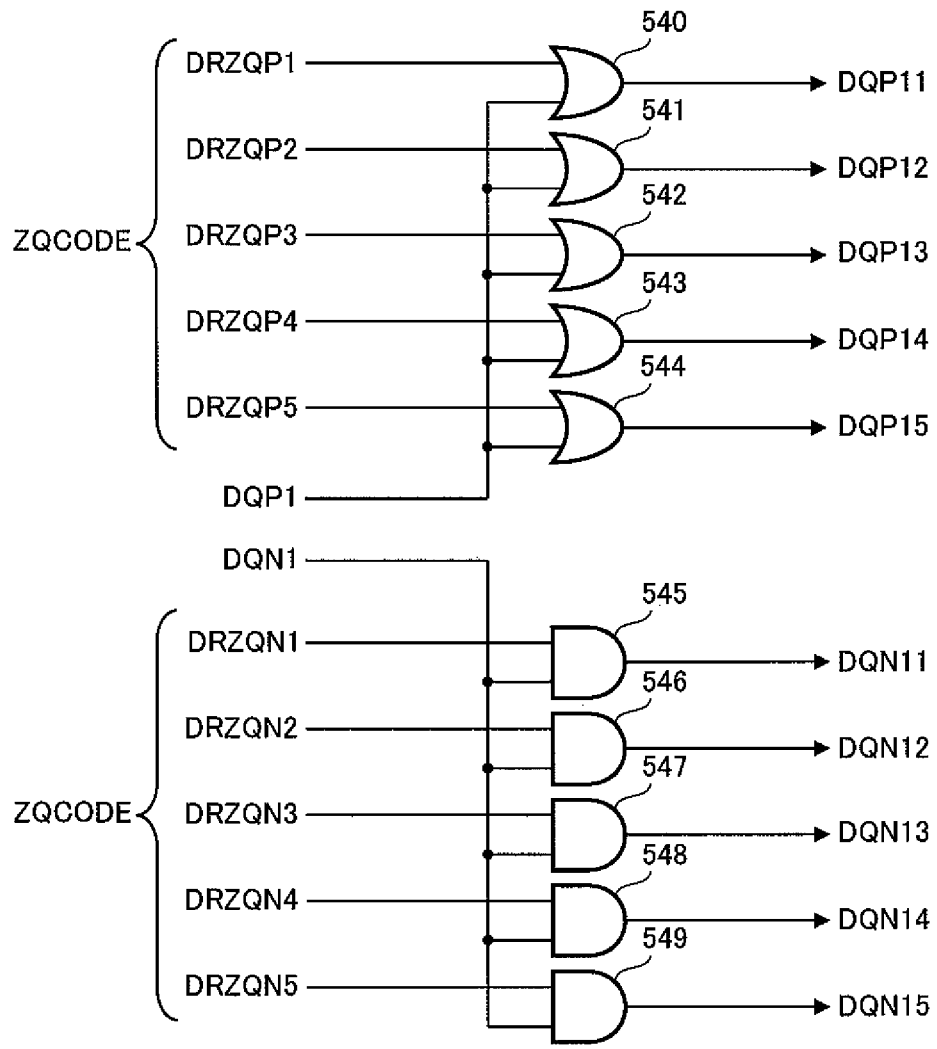
FIG. 3 is a circuit diagram of the impedance control circuit 511.

As shown in FIG. 3, the impedance control circuit 511 includes five OR circuits 540 to 544 (pull-up logic circuits), which receive pull-up data DQP1 and an impedance code ZQCODE; and five AND circuits 545 to 549 (pull-down logic circuits), which receive pull-down data DQN1 and an impedance code ZQCODE. As shown in FIG. 3, the impedance code ZQCODE is made up of pull-up impedance adjustment codes DRZQP1 to DRZQP5 and pull-down impedance adjustment codes DRZQN1 to DRZQN5. The pull-up impedance adjustment codes DRZQP1 to DRZQP5 are supplied to the OR circuits 540 to 544, respectively. The pull-down impedance adjustment codes DRZQN1 to DRZQN5 are supplied to the AND circuits 545 to 549, respectively.

In the above-described configuration, the values of pull-up data DQP11 to DQP15, which are output signals of the OR circuits 540 to 544, respectively, are fixed to a high level when the corresponding pull-up impedance adjustment codes are at a high level. When the corresponding pull-up impedance adjustment codes are at a low level, the values of pull-up data DQP11 to DQP15 become equal to the pull-up data DQP1. The values of pull-down data DQN11 to DQN15, which are output signals of the AND circuits 545 to 549, respectively, are fixed to a low level when the corresponding pull-down impedance adjustment codes are at a low level. When the corresponding pull-down impedance adjustment codes are at a high level, the values of pull-down data DQN11 to DQN15 become equal to the pull-down data DQN1.

As shown in FIG. 2, the pull-up data DQP11 to DQP15 and pull-down data DQN11 to DQN15 output from the impedance control circuit 511 are supplied to the slew rate adjustment circuit 531 via the level shift circuit 520. Similarly, the pull-up data DQP21 to DQP25 and pull-down data DQN21 to DQN25 output from the impedance control circuit 512 are supplied to the slew rate adjustment circuit 532 via the level shift circuit 520. The pull-up data DQP31 to DQP35 and pull-down data DQN31 to DQN35 output from the impedance control circuit 513 are supplied to the slew rate adjustment circuit 533 via the level shift circuit 520.

The level shift circuit 520 is a circuit that converts the amplitude value of an input signal from VPERI to VDD. As shown in FIG. 2, the inverters 431 and 441, the NAND gate circuits 432, 433, 442, and 443, and the impedance control circuits 511 to 513 (which all are referred to as first circuits) all are so formed as to operate on the internal voltage VPERI. On the other hand, the slew rate adjustment circuits 531 to 533 and the unit buffers 501 to 507 (which all are referred to as second circuits) all are so formed as to operate on the external voltage VDD (external voltage VDDQ). Accordingly when the output signals of the former (pull-up data DQP11 to DQP15, pull-down data DQN11 to DQN15, and the like) are supplied to the latter, the amplitude values need to be converted from VPERI to VDD. The level shift circuit 520 is provided to carry out the conversion.

Figure 4:
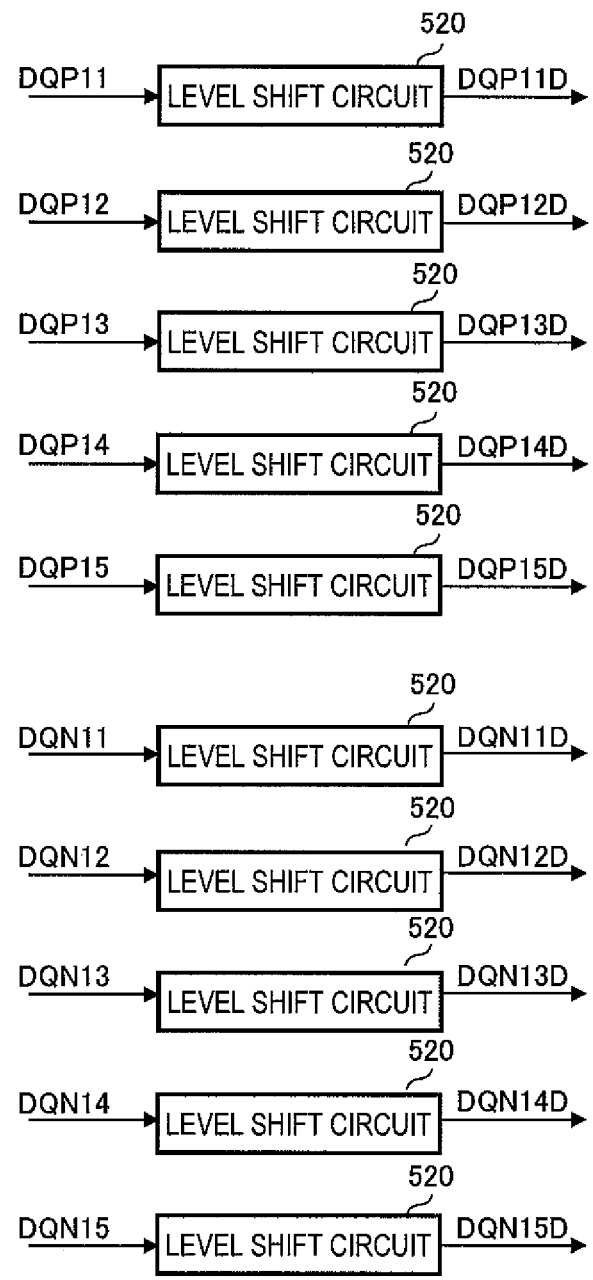
FIG. 4 is a block diagram showing the configuration of the level shift circuits 520.

As shown in FIG. 4, the level shift circuits 520 are provided for each of the output signals of the impedance control circuits 511 to 513. Incidentally, FIG. 4 only shows a portion corresponding to the impedance control circuit 511; however, the portions corresponding to the impedance control circuits 512 and 513 are the same. Each level shift circuit 520 has the same configuration.

Figure 5:
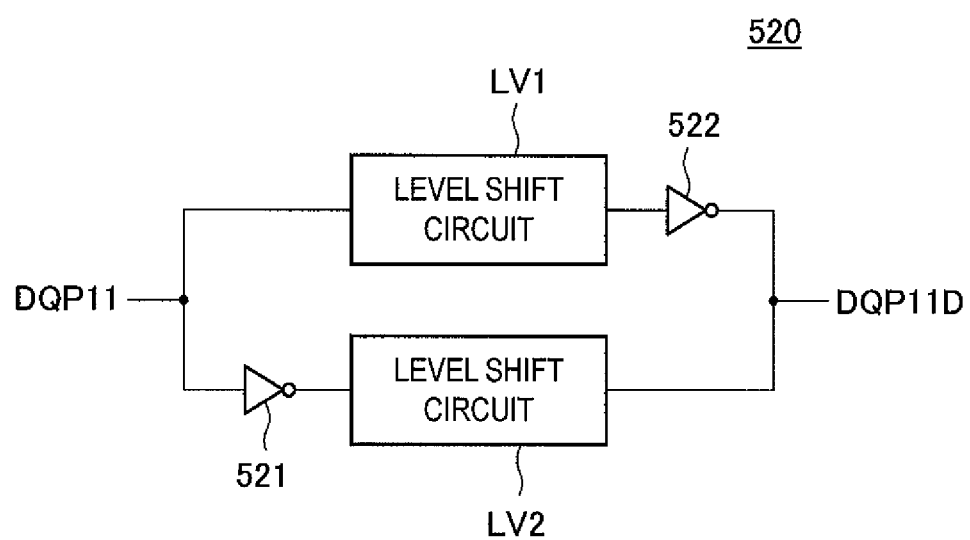
FIG. 5 is a block diagram showing the configuration of the level shift circuit 520.

As shown in FIG. 5, the level shift circuit 520 includes two level shift circuits LV1 and LV2; an inverter 521, which inverts the pull-up data DQP11; and an inverter 522, which inverts an output of the level shift circuit LV1. Incidentally, FIG. 5 only shows the level shift circuit 520 corresponding to the pull-up data DQP11. However, the other level shift circuits 520 are the same. The two level shift circuits LV1 and LV2 have the same circuit configuration. To the level shift circuit LV1, the pull-up data DQP11 are input without being inverted. To the level shift circuit LV2, the pull-up data DQP inverted by the inverter 521 are input. An output of the level shift circuit LV1 inverted by the inverter 522, and an output of the level shift circuit LV2 are short-circuited before being output as pull-up data DQP11D.

Incidentally, in the example shown in FIG. 5, to the level shift circuit LV1, the pull-up data DQP11 are input without being inverted. However, as long as the level shift circuits LV1 and LV2 are supplied with complementary input signals, the circuit configuration of an input circuit provided before the level shift circuits LV1 and LV2 can be of any type. Similarly, in the example shown in FIG. 5, an output of the level shift circuit LV2 is short-circuited to an output of the inverter 522 without being inverted. However, as long as the complementary output signals output from the level shift circuits LV1 and LV2 are so converted as to be in phase with each other before being short-circuited, the circuit configuration of an output circuit provided after the level shift circuits LV1 and LV2 can be of any type.

Figure 6A:
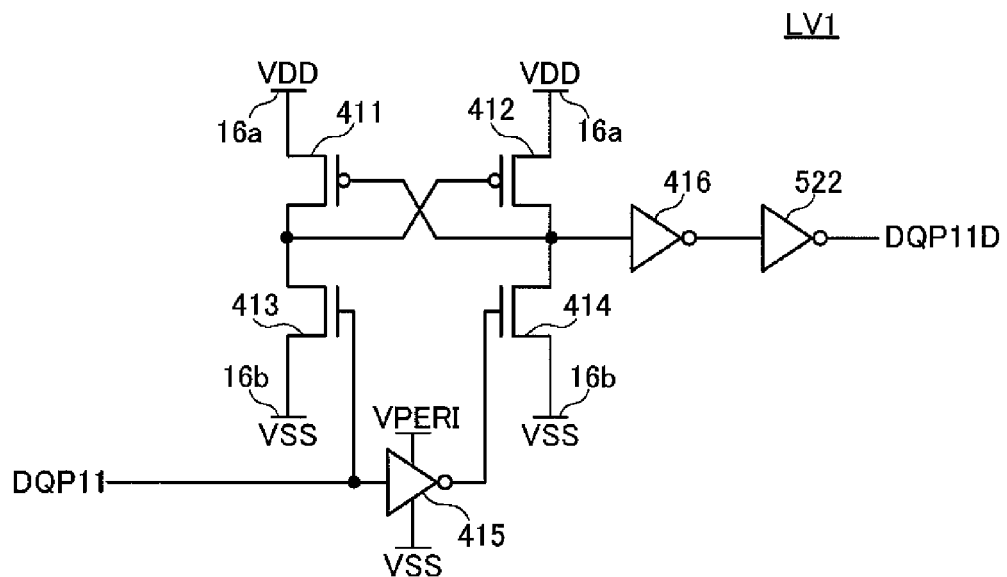
FIG. 6A is a circuit diagram of the level shift circuit LV1 as well as the inverter 522.

As shown in FIG. 6A, the level shift circuit LV1 includes cross-coupled P-channel MOS transistors 411 and 412, whose sources are connected to the power supply terminal 16a (external voltage VDD); and N-channel MOS transistors 413 and 414, whose sources are connected to the power supply terminal 17b (external voltage VSS) and which are connected to the transistors 411 and 412 in series, respectively. To the gate electrode of the transistor 413, the pull-up data DQP11 are supplied. To the gate electrode of the transistor 414, the pull-up data DQP11 are supplied via the inverter 415. From the point of connection of the transistor 412 and the transistor 414, a level-shifted output signal is extracted, and then is output as pull-up data DQP11D via the inverters 416 and 522.

Figure 6B:
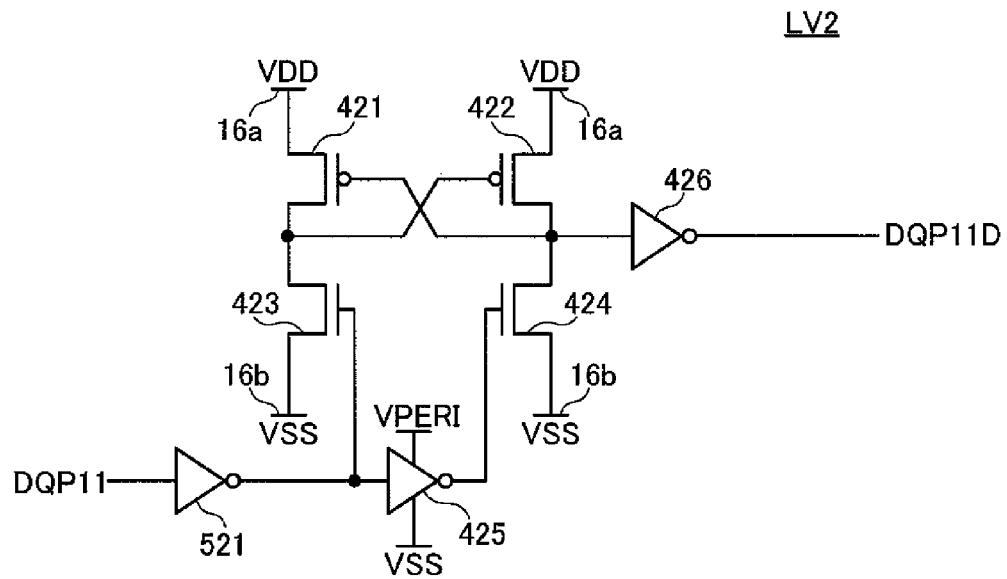
FIG. 6B is a circuit diagram of the level shift circuit LV2 as well as the inverter 521.

The level shift circuit LV2 has exactly the same circuit configuration. That is, as shown in FIG. 6B, the level shift circuit LV2 includes cross-coupled P-channel MOS transistors 421 and 422, whose sources are connected to the power supply terminal 16a (external voltage VDD); and N-channel MOS transistors 423 and 424, whose sources are connected to the power supply terminal 16b (external voltage VSS) and which are connected to the transistors 421 and 422 in series, respectively. To the gate electrode of the transistor 423, the pull-up data DQP11 are supplied via the inverter 521. To the gate electrode of the transistor 424, the pull-up data DQP11 are supplied via the inverters 521 and 425. From the point of connection of the transistor 422 and the transistor 424, a level-shifted output signal is extracted, and then is output as pull-up data DQP11D via the inverter 426.

Then, as shown in FIG. 5, an output of the level shift circuit LV1, which has passed through the inverter 522, and an output of the level shift circuit LV2 are short-circuited. In this manner, the outputs of the level shift circuits LV1 and LV2 are combined, and the waveform of the pull-up data DQP11D is the combined waveform of the outputs as a result. The pull-up data DQP11D is, as shown in FIG. 2, supplied to the slew rate adjustment circuit 531.

The slew rate adjustment circuits 531 to 533 are circuits that adjust the slew rate of a unit buffer in a group that the slew rate adjustment circuits 531 to 533 each belong to based on the above-described impedance code ZQCODE. The reason why the slew rate of a unit buffer can be adjusted based on the impedance code ZQCODE is described below. That is, the reason why the actual impedance of a unit buffer can be higher than a designed value is that the performance of transistors that make up the unit buffer could be lower than a designed value. In such a case, the slew rate of the unit buffer tends to drop below the designed value. In this case, by raising the slew rate of the unit buffer, it is possible to bring the slew rate closer to the designed value. Conversely, the reason why the actual impedance of a unit buffer can be lower than a designed value is that the performance of transistors that make up the unit buffer could be higher than a designed value. In such a case, the slew rate of the unit buffer tends to rise above the designed value. In this case, by decreasing the slew rate of the unit buffer, it is possible to bring the slew rate closer to the designed value. Hereinafter, the configuration of the slew rate adjustment circuit 531 will be described in detail. Even though the slew rate adjustment circuits 532 and 533 will not be described in detail, the configurations of the slew rate adjustment circuits 532 and 533 are the same as that of the slew rate adjustment circuit 531.

Figures 7A, 7B:
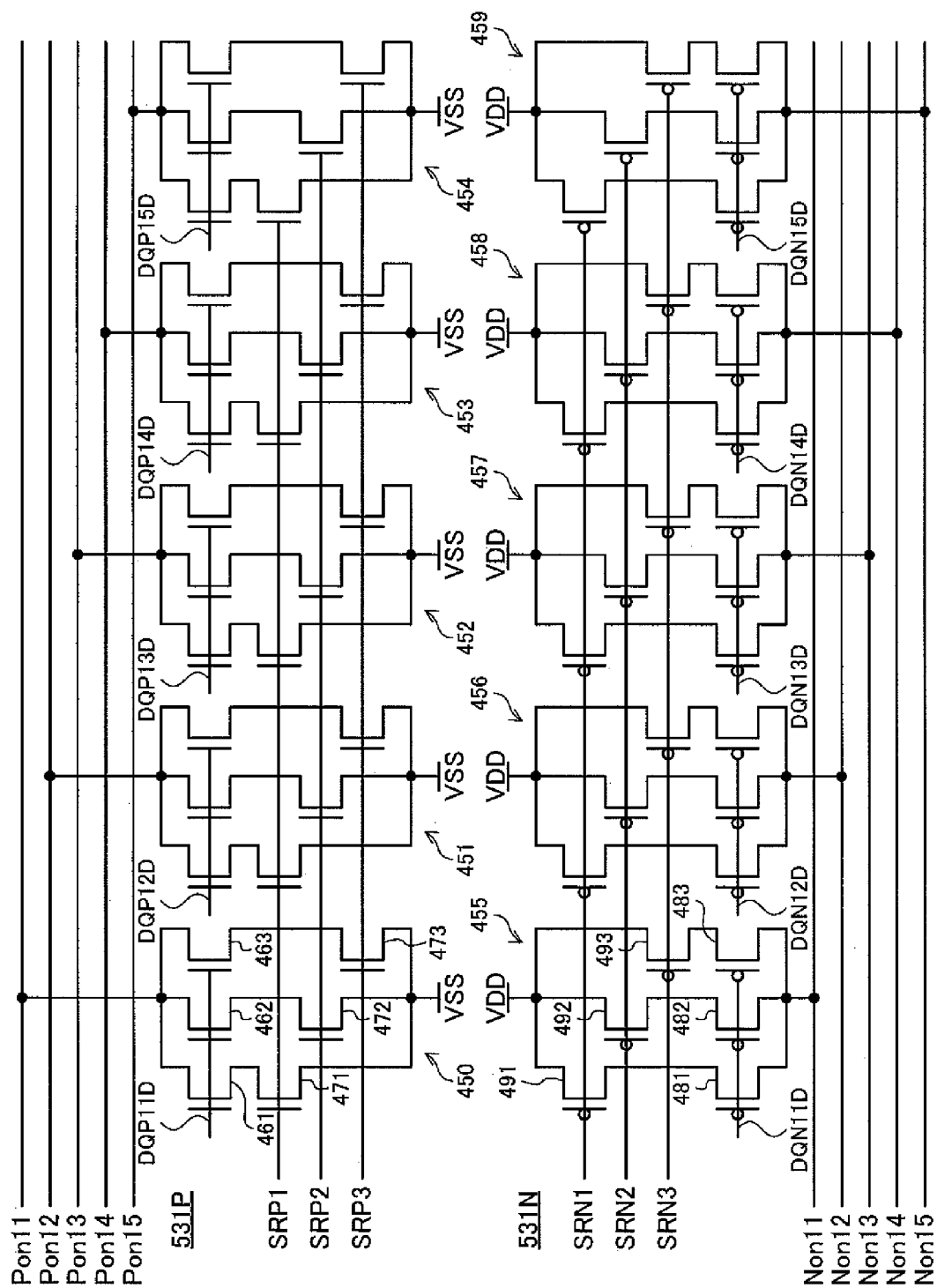
FIG. 7A is a circuit diagram of the slew rate adjustment circuit 531P included in the slew rate adjustment circuit 531.
FIG. 7B is a circuit diagram of the slew rate adjustment circuit 531N included in the slew rate adjustment circuit 531.

The slew rate adjustment circuit 531 includes, as shown in FIGS. 7A and 7B, a slew rate adjustment circuit 531P, which adjusts the slew rates of pull-up data DQP11D to DQF15D; and a slew rate adjustment circuit 531N, which adjusts the slew rates of pull-down data DQN11D to DQN15D.

The slew rate adjustment circuit 531P includes driving circuits 450 to 454, which each generate ON signals Pon11 to Pon15 based on the pull-up data DQP11D to DQP15D. As shown in FIG. 7A, the driving circuit 450 includes N-channel MOS transistors (selection transistors) 461 to 463, and N-channel MOS transistors (adjustment transistors) 471 to 473. The selection transistor 461 and the adjustment transistor 471 are connected in series between a line, to which the ON signal Pon11 is output, and a power supply line (power supply terminal 16b), to which the external voltage VSS is supplied. The same is true for the selection transistor 462 and the adjustment transistor 472, and for the selection transistor 463 and the adjustment transistor 473. To control terminals of the selection transistors 461 to 463, the pull-up data DQP11D are commonly supplied. To control terminals of the adjustment transistors 471 to 473, slew rate adjustment signals SRP1 to SRP3 are respectively supplied. The configurations of the driving circuits 451 to 454 are the same as that of the driving circuit 450.

In the above configuration, the ON signals Pon11 to Pon15 are activated to a low level when the corresponding pull-up data DQP11D to DQP15D are at a high level. The waveforms of the ON signals Pon11 to Pon15 are adjusted by the slew rate adjustment signals SRP1 to SRP3. More specifically, as the number of adjustment transistors in each driving circuit that are turned ON increases, the slew rates of the ON signals Pon11 to Pon15 rise.

The slew rate adjustment signals SRP1 to SRP3 are signals that are generated by a slew rate adjustment signal generation circuit (not shown) based on pull-up impedance adjustment codes DRZQP1 to DRZQP5. The slew rate adjustment signal generation circuit generates the slew rate adjustment signals SRP1 to SRP3 in such a way that, as the impedance indicated by the pull-up impedance adjustment codes DRZQP1 to DRZQP5 goes higher, the adjustment transistors in each driving circuit that are turned ON increase in number. Conversely, the slew rate adjustment signal generation circuit generates the slew rate adjustment signals SRP1 to SRP3 in such a way that, as the impedance indicated by the pull-up impedance adjustment codes DRZQP1 to DRZQP5 goes lower, the adjustment transistors in each driving circuit that are turned OFF increase in number. Accordingly, as the impedance indicated by the pull-up impedance adjustment codes DRZQP1 to DRZQP5 goes higher, the slew rates of the ON signals Pon11 to Pon15 rise. As the impedance indicated by the pull-up impedance adjustment codes DRZQP1 to DRZQP5 goes lower, the slew rates of the ON signals Pon11 to Pon15 fall.

The slew rate adjustment circuit 531N includes driving circuits 455 to 459, which each generate ON signals Non11 to Non15 based on the pull-down data DQN11D to DQN15D. As shown in FIG. 7B, the driving circuit 455 includes P-channel MOS transistors (selection transistors) 481 to 483, and P-channel MOS transistors (adjustment transistors) 491 to 493. The selection transistor 481 and the adjustment transistor 491 are connected in series between a line, to which the ON signal Non11 is output, and a power supply line (power supply terminal 16a), to which the external voltage VDD is supplied. The same is true for the selection transistor 482 and the adjustment transistor 492, and for the selection transistor 483 and the adjustment transistor 493. To control terminals of the selection transistors 481 to 483, the pull-down data DQN11D are commonly supplied. To control terminals of the adjustment transistors 491 to 493, slew rate adjustment signals SRN1 to SRN3 are respectively supplied. The configurations of the driving circuits 456 to 459 are the same as that of the driving circuit 455.

In the above configuration, the ON signals Non11 to Non15 are activated to a high level when the corresponding pull-down data DQN11D to DQN15D are at a low level. The waveforms of the ON signals Non11 to Non15 are adjusted by the slew rate adjustment signals SRN1 to SRN3. More specifically, as the number of adjustment transistors in each driving circuit that are turned ON increases, the slew rates of the ON signals Non11 to Non15 rise.

The slew rate adjustment signals SRN1 to SRN3 are signals that are generated by the above-mentioned slew rate adjustment signal generation circuit based on pull-down impedance adjustment codes DRZQN1 to DRZQN5. The slew rate adjustment signal generation circuit generates the slew rate adjustment signals SRN1 to SRN3 in such a way that, as the impedance indicated by the pull-down impedance adjustment codes DRZQN1 to DRZQN5 goes higher, the adjustment transistors in each driving circuit that are turned ON increase in number. Conversely, the slew rate adjustment signal generation circuit generates the slew rate adjustment signals SRN1 to SRN3 in such a way that, as the impedance indicated by the pull-down impedance adjustment codes DRZQN1 to DRZQN5 goes lower, the adjustment transistors in each driving circuit that are turned OFF increase in number. Accordingly, as the impedance indicated by the pull-down impedance adjustment codes DRZQN1 to DRZQN5 goes higher, the slew rates of the ON signals Non11 to Non15 rise. As the impedance indicated by the pull-down impedance adjustment codes DRZQN1 to DRZQN5 goes lower, the slew rates of the ON signals Non11 to Non15 fall.

The ON signals Pon11 to Pon15 and Non11 to Non15, whose slew rates have been adjusted as described above, are commonly supplied to the corresponding unit buffers 501 to 504. Similarly, adjustments also are made to the slew rates of the ON signals Pon21 to Pon25 and Non21 to Non25, which are generated by the slew rate adjustment circuit 532, as well as to the slew rates of the ON signals Pon31 to Pon35 and Non31 to Non35, which are generated by the slew rate adjustment circuit 533. Then, the ON signals Pon21 to Pon25 and Non21 to Non25 and the ON signals Pon31 to Pon35 and Non31 to Non35 are supplied to the corresponding unit buffers.

Figure 8:
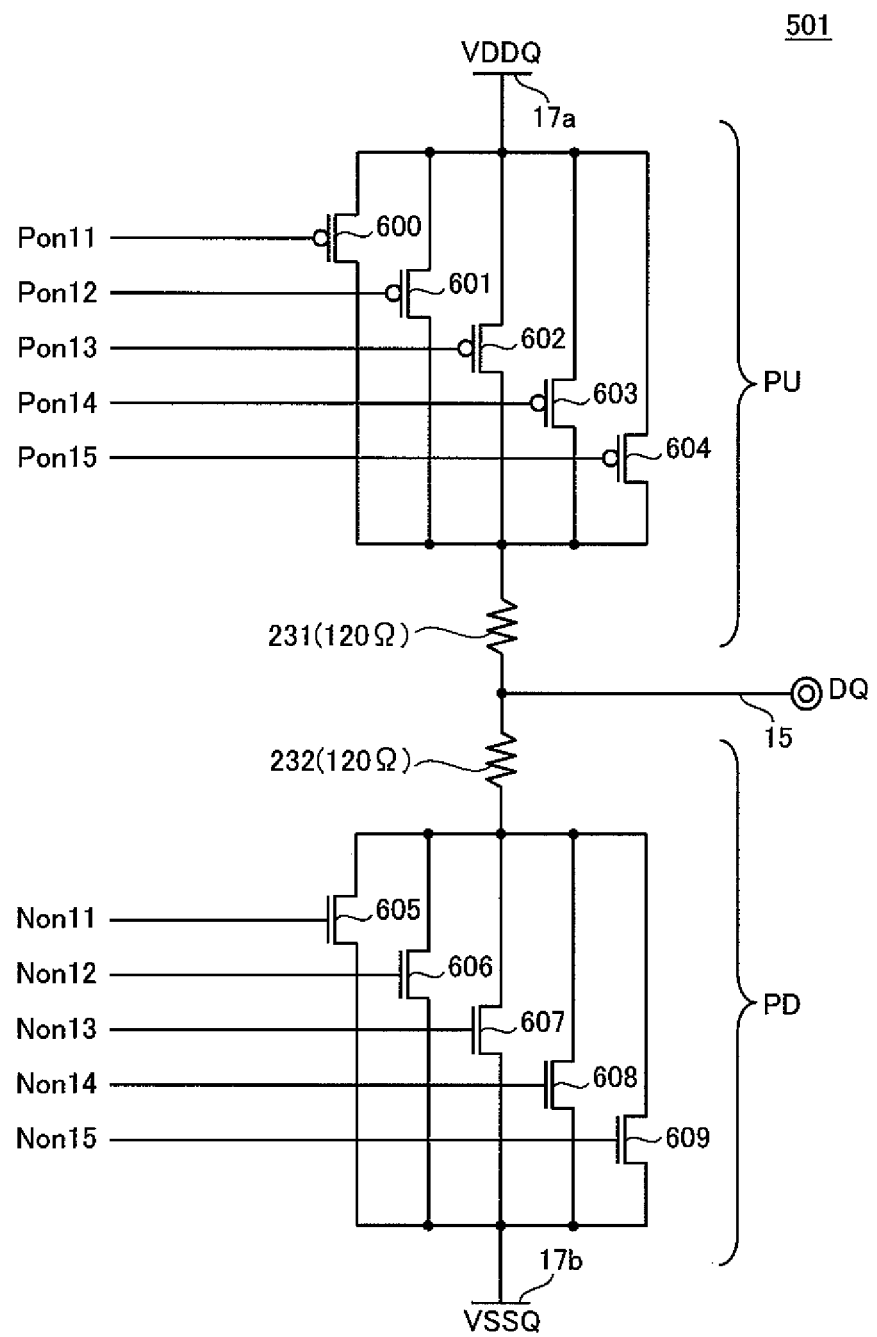
FIG. 8 is a diagram showing the circuit configuration of the unit buffer 501.

As shown in FIG. 8, the unit buffer 501 includes a pull-up circuit PU and a pull-down circuit PD. Although not shown in FIG. 8, the unit buffers 502 to 507 have the same circuit configuration. The pull-up circuit PU includes a 120-Ω resistor 231, one end of which is connected to the data input/output terminal 15; and five P-channel MOS transistors 600 to 604, which are connected in parallel between the other end of the resistor 231 and the power supply terminal 17a (external voltage VDDQ). The pull-down circuit PD includes a 120-Ω resistor 232, one end of which is connected to the data input/output terminal 15; and five N-channel MOS transistors 605 to 609, which are connected in parallel between the other end of the resistor 232 and the power supply terminal 17b (external voltage VSSQ).

To the gates of the transistors 600 to 604, the ON signals Pon11 to Pon15 are respectively supplied. To the gates of the transistors 605 to 609, the ON signals Non11 to Non15 are respectively supplied. In this manner, the ten transistors included in the unit buffer 501 are separately controlled so as to be turned ON/OFF in response to the ON signals Pon11 to Pon15 and Non11 to Non15 of the ten lines.

In order to fine-tune the impedance in a wide range, it is preferred that the W/L ratios (or ratios of gate width/gate length) of a plurality of transistors that make up the parallel circuit are different from each other. In particular, the weighting of a power of 2 is preferred. Given the above, according to the present embodiment, when the W/L ratio of the transistor 600 is 1WLp, the W/L ratios of the transistors 601 to 604 are set to 2WLp, 4WLp, 8WLp, and 16WLp, respectively. Similarly, the W/L ratios of the transistors 605 to 609 are set to 1WLp, 2WLp, 4WLp, 8WLp, and 16WLp, respectively. As a result, by appropriately selecting transistors that are turned ON by impedance codes ZQCODE, regardless of variations caused by production conditions, changes in temperature, and other factors, it is possible to fix the on-resistance of the pull-up circuit PU and pull-down circuit PD (including the resistance of the resistors 231 and 232) to a desired impedance (240Ω).

The above has described the internal configuration of the data input/output circuit 78. As described above, in the semiconductor device 10, the level shift circuit 520 is provided between the impedance control circuits 511 to 513 and the slew rate adjustment circuits 531 to 532. The configuration is a novel configuration proposed by the inventor of the present embodiment. Conventionally, the level shift circuit 520 has been placed closer to the inside of the semiconductor device 10 than the impedance control circuits 511 to 513 (i.e. at a position close to the DLL circuit 23). By adopting the configuration of the present embodiment, in the semiconductor device 10, it is possible to generate accurate internal clock signals LCLKOET and LCLKOEFT without the need to provide, in the DLL circuit 23, a circuit that operates on the external voltage VDD (the above-mentioned second advantageous effect). The details of the above point will be described together with the following description of the DLL circuit 23.

Figure 9:
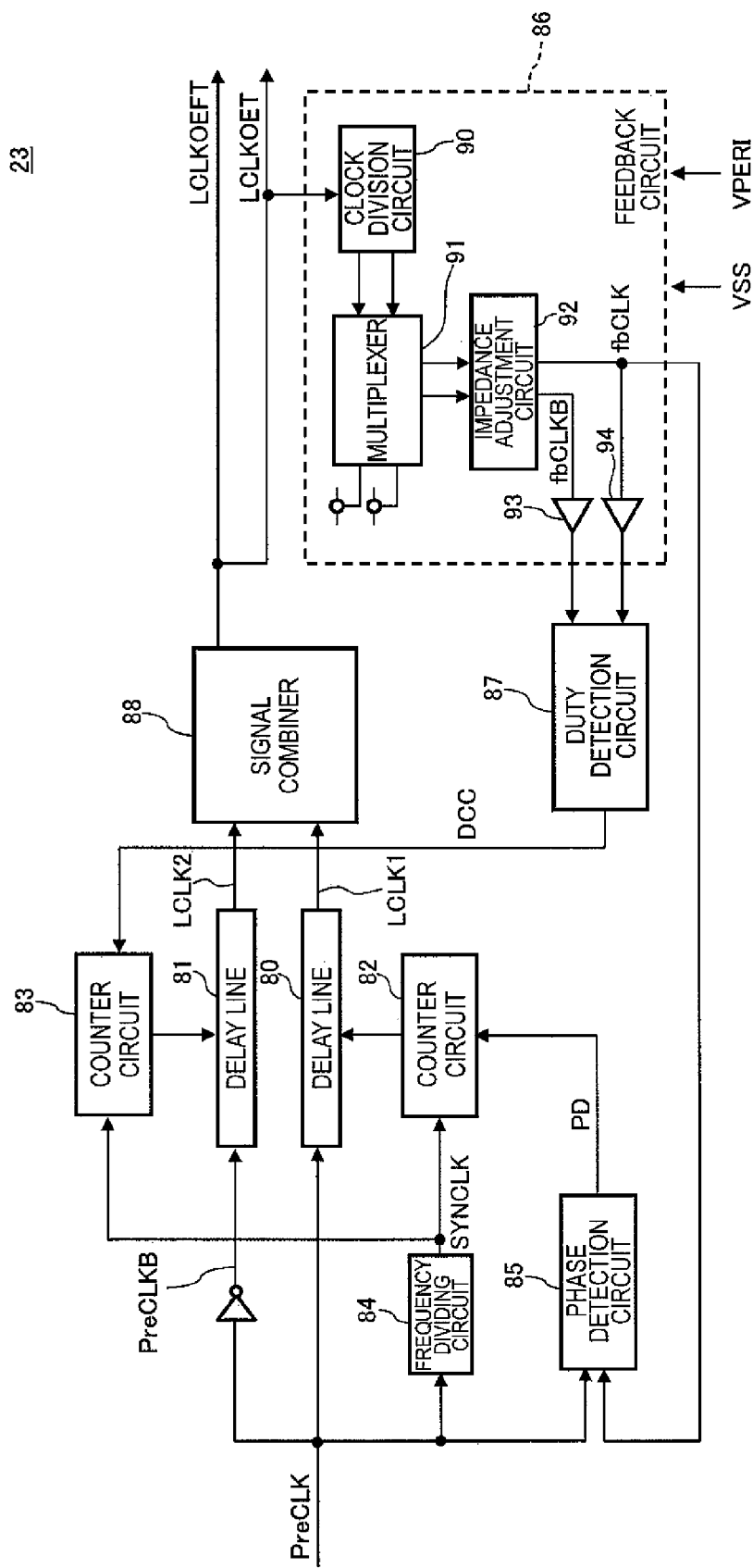
FIG. 9 is a block diagram showing the configuration of the DLL circuit 23.

As shown in FIG. 9, the DLL circuit 23 includes delay lines 80 and 81, counter circuits 82 and 83, a frequency dividing circuit 84, a phase detection circuit 85, a feedback circuit 86, a duty detection circuit 87, and a signal combiner 88. The above circuits all are so formed as to operate on the internal voltage VPERI. The DLL circuit 23 includes no circuits that operate on the external voltage VDD.

As described above, the DLL circuit 23 is a circuit that generates the internal clock signals LCLKOET and LCLKOEFT. Each of the circuits except the feedback circuit 86 make up an internal clock signal generation circuit, which generates the internal clock signals LCLKOET and LCLKOEFT based on an external clock signal and an output signal of the feedback circuit 86. According to the present embodiment, as clearly shown in FIG. 9, the internal clock signals LCLKOET and LCLKOEFT are the same signal. However, a delay circuit may be disposed on a signal line of the internal clock signal LCLKOET to delay only the internal clock signal LCLKOET.

As shown in FIG. 9, the feedback circuit 86 includes a structure in which a clock division circuit 90, a multiplexer 91, and an impedance adjustment circuit 92 are connected in series. To the clock division circuit 90, the internal clock signal LCLKOET is supplied. From the impedance adjustment circuit 92, complementary feedback clock signals fbCLK and fbCLKB are output. The feedback clock signal fbCLK is supplied to the phase detection circuit 85, and also to the duty detection circuit 87 via a buffer 94. The feedback clock signal fbCLKB is supplied to the phase detection circuit 85 via a buffer 93.

The clock division circuit 90, the multiplexer 91, and the impedance adjustment circuit 92 each are a circuit that generates a delay equivalent to that generated by the clock division circuit 77 (FIG. 1), the multiplexer 76 (FIG. 1), and the impedance control circuits 511 to 513 (FIG. 2), respectively. That is, the complementary feedback clock signals fbCLK and fbCLKB are delayed internal clock signals LCLKOET whose delay amount is equivalent to that for the output signals of the impedance control circuits 511 to 513 (pull-up data DQP11 and the like) shown in FIG. 2. The above circuits all are circuits that operate on the internal voltage VPERI. Therefore, the clock division circuit 90, the multiplexer 91, and the impedance adjustment circuit 92, too, are so formed as to operate on the internal voltage VPERI. The feedback circuit 86 includes no circuit that operate on the external voltage VDD.

The delay line 80 is a circuit that generates an internal clock signal LCLK1 by delaying an internal clock signal PreCLK. A process of adjusting the amount of delay using the delay line 80 is performed based on a phase difference PD between the internal clock signal PreCLK and the feedback clock signal fbCLK. The phase difference PD is detected by the phase detection circuit 85.

The delay line 81 is a circuit that generates an internal clock signal LCLK2 by delaying an internal clock signal PreCLKB, which is obtained by inverting the internal clock signal PreCLK through an inverter. A process of adjusting the amount of delay using the delay line 81 is performed based on the duty DCC of the complementary internal clock signal LCLKOET. The duty DCC is detected by the duty detection circuit 87. The duty detection circuit 87 includes a function of detecting the duty of the internal clock signal LCLKOET based on the feedback clock signals fbCLK and fbCLKB.

The internal clock signals LCLK1 and LCLK2 generated by the delay lines 80 and 81 are supplied to the signal combiner 88. The signal combiner 88 generates the internal clock signals LCLKOET and LCLKOEFT based on the internal clock signals LCLK1 and LCLK2.

Although not specifically limited, it is preferred that the delay lines 80 and 81 include a coarse delay line, which delays an external clock signal at a relatively coarse adjustment pitch, and a fine delay line, which delays an external clock signal at a relatively fine adjustment pitch.

The counter circuit 82 is a circuit that adjusts the amount of delay by the delay line 80. The count value of the counter circuit 82 is updated based on the phase difference PD supplied from the phase detection circuit 85 and in synchronization with a sampling clock signal SYNCLK supplied from the frequency dividing circuit 84, which is described later. More specifically, if the phase difference PD indicates that the phase has advanced too much, the counter circuit 82 carries out the up-counting of the count value thereof in synchronization with the sampling clock signal SYNCLK. In response, the delay line 80 delays a rising edge of the internal clock signal LCLK1. If the phase difference PD indicates that the phase has delayed, the counter circuit 82 carries out the down-counting of the count value thereof in synchronization with the sampling clock signal SYNCLK. In response, the delay line 80 accelerates a rising edge of the internal clock signal LCLK1. In that manner, the counter circuit 82 and the delay line 80 adjust the position of the rising edge of the internal clock signal LCLK1 based on the phase difference.

The frequency dividing circuit 84 is a circuit that generates the sampling clock signal SYNCLK by carrying out the frequency dividing of the internal clock signal PreCLK. The sampling clock signal SYNCLK is supplied to the counter circuits 82 and 83, where the sampling clock signal SYNCLK is used as a synchronization signal indicating the update timing of the count value. The reasons why the frequency dividing circuit 84 is used are that a certain period of time is required for updating the counter circuits 82 and 83 and changing the amounts of delay by the delay lines 80 and 81; and that it is difficult to carry out the updating of the counter circuits 82 and 83 and the changing of the amounts of delay by the delay lines 80 and 81 at every cycle of the internal clock signal PreCLK. Moreover, if the updating of the counter circuits 82 and 83 and the changing of the amounts of delay by the delay lines 80 and 81 are carried out more frequently than necessary, power consumption increases significantly.

The counter circuit 83 is a circuit that adjusts the amount of delay by the delay line 81. The count value of the counter circuit 83 is updated in synchronization with the sampling clock signal SYNCLK based on a duty detection signal DCC supplied from the duty detection circuit 87. More specifically, if the duty detection signal DCC indicates a duty of less than 50%, the counter circuit 83 carries out the up-counting of the count value thereof in synchronization with the sampling clock signal SYNCLK. In response, the delay line 81 delays a rising edge of the internal clock signal LCLK2. If the duty detection signal DCC indicates a duty of more than 50%, the counter circuit 83 carries out the down-counting of the count value thereof in synchronization with the sampling clock signal SYNCLK. In response, the delay line 81 hastens a rising edge of the internal clock signal LCLK2. In that manner, the counter circuit 83 and the delay line 81 adjust the position of the rising edge of the internal clock signal LCLK2 based on the duty.

The circuits in the DLL circuit 23, which are described above, all are so formed as to operate on the internal voltage VPERI. Accordingly, the internal clock signals LCLKOET and LCLKOEFT are not affected by a change in the external voltage VDD. Therefore, the phases of the internal clock signals LCLKOET and LCLKOEFT are prevented from varying due to the variation in the external voltage VDD. In this manner, in the semiconductor device 10, it is possible to curb a decline in the latch margin of the latency counter 55 that is associated with a change in the external voltage VDD.

As explained above with reference to FIG. 2, the data input/output circuit 78 includes circuits that operate on the external voltage VDD (including those operating on the external voltage VDDQ). Accordingly, in order to exactly reproduce a delay in the data input/output circuit 78, also the replica circuits of the circuits that operate on the external voltage VDD need to be disposed in the feedback circuit 86. However, the semiconductor device 10 does not employ such a configuration. While this is for preventing the variations in the phases of the internal clock signals LCLKOET and LCLKOEFT associated with a change in the external voltage VDD, the accuracy of the internal clock signals LCLKOET and LCLKOEFT is sacrificed. However, as described above, in the data input/output circuit 78 of the semiconductor device 10, the level shift circuits 520 are provided between the impedance control circuits 511 to 513 and the slew rate adjustment circuits 531 to 532, thereby reducing the number of circuitry portions operating on the external voltage VDD in comparison to conventional cases. Therefore, without providing the replica circuits of the circuits operating on the external voltage VDD in the feedback circuit 86, it is possible to generate accurate internal clock signals LCLKOET and LCLKOEFT.

Incidentally, a delay circuit that causes a predetermined amount of delay may be inserted after the impedance adjustment circuit 92. By bringing the amount of delay caused by the above delay circuit as much close to the amount of delay of a circuit that is among the circuits contained in the data input/output circuit 78 and operates on the external voltage VDD as possible, the accuracy of the internal clock signals LCLKOET and LCLKOEFT can be further raised.

The following describes in detail the above first advantageous effect of the present embodiment, as well as the internal configuration of the latency counter 55.

Figure 10:
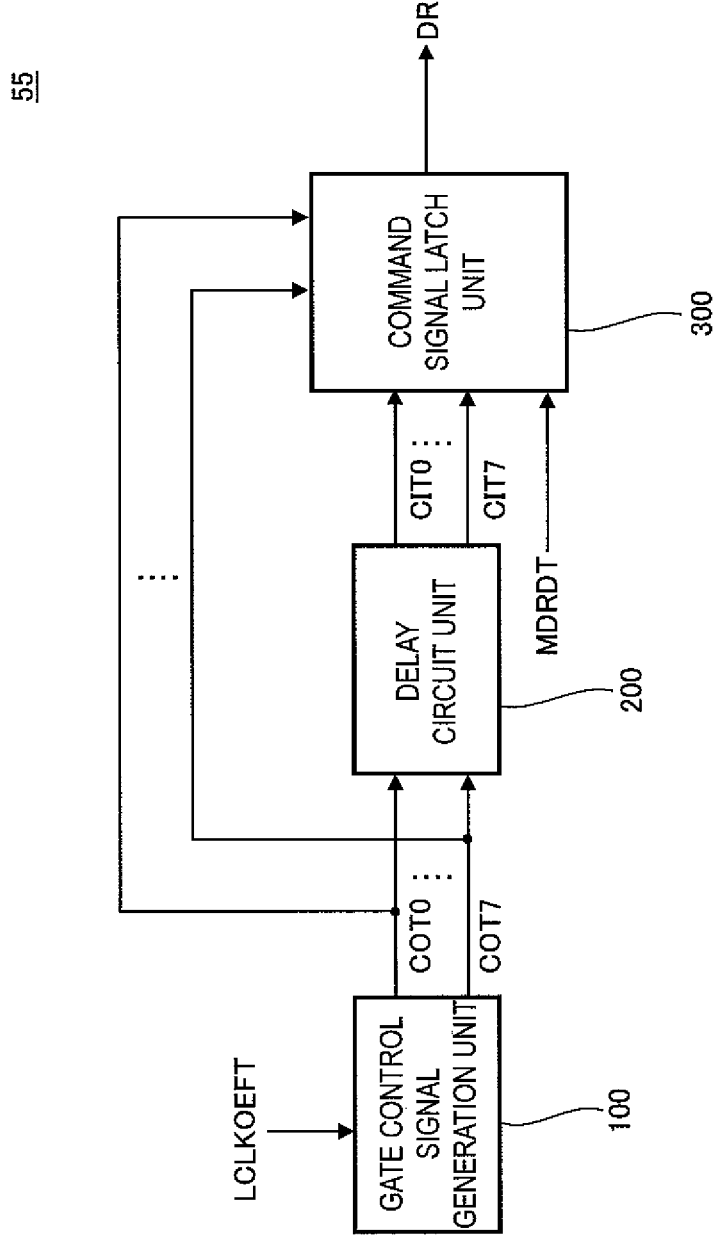
FIG. 10 is a block diagram showing the configuration of the latency counter 55.

As shown in FIG. 10, the latency counter 55 includes a gate control signal generation unit 100, a delay circuit unit 200, and a command signal latch unit 300. Appropriately referring to FIG. 11, the following describes the configuration of the latency counter 55.

Figure 11:
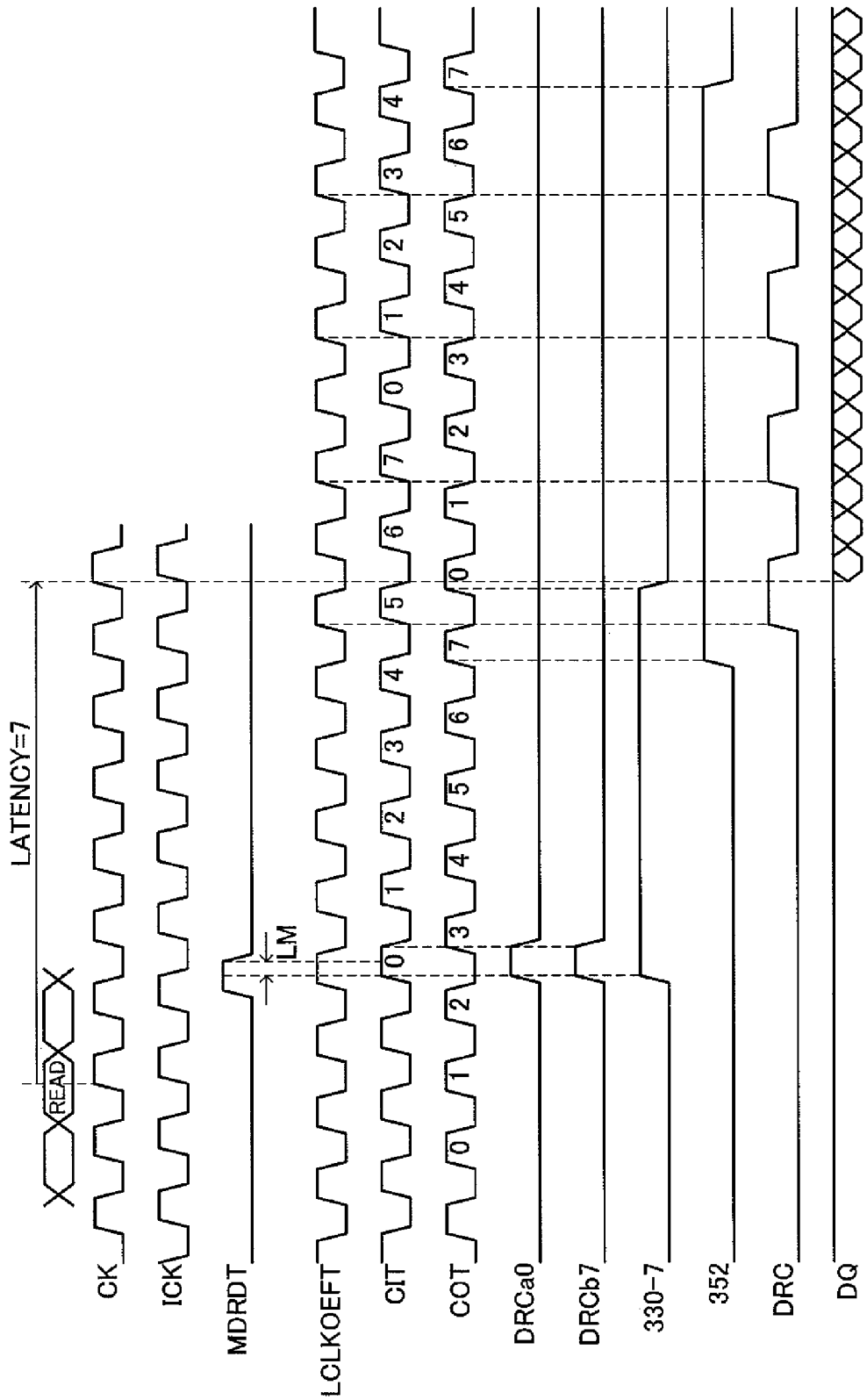
FIG. 11 is a diagram showing a timing chart of each signal pertaining to the latency counter 55.

The gate control signal generation unit 100 is a circuit that generates eight-line output gate signals COT0 to COT7 from the internal clock signal LCLKOEFT. The output gate signals COT0 to COT7 are so formed as to be sequentially activated in response to each clock, as shown in FIG. 11.

Figure 12:
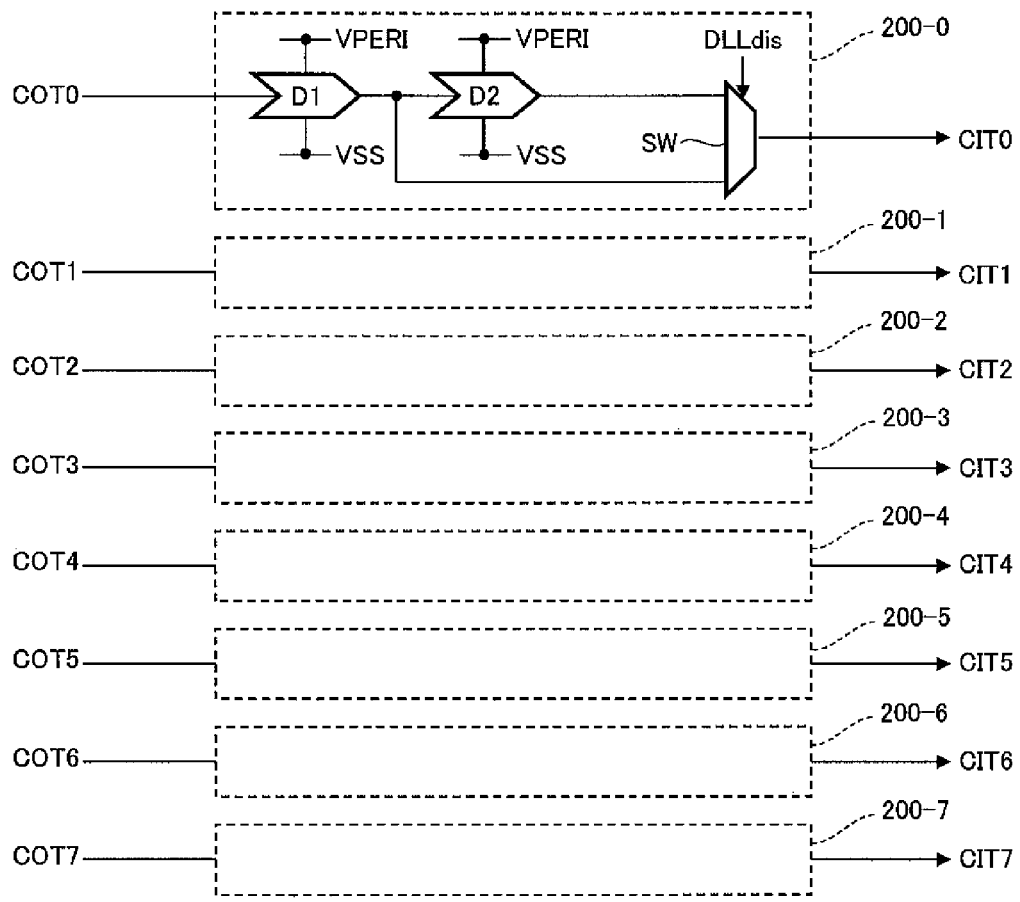
FIG. 12 is a block diagram showing the configuration of the delay circuit unit 200 and a circuit diagram of the delay circuit 200-0.

The delay circuit unit 200 is a circuit that generates eight-line input gate signals CIT0 to CIT7 by delaying the output gate signals COT0 to COT7. As shown in FIG. 12, the delay circuit unit 200 includes delay circuits 200-0 to 200-7, which each are so formed as to generate input gate signals CIT0 to CIT7 in response to the output gate signals COT0 to COT7, respectively.

As shown in FIG. 12, the delay circuit 200-0 includes a structure in which a delay circuit D1, a delay circuit D2, and a switch SW are connected in series between an input port, to which the output gate signal COT0 is supplied, and an output port, from which the input gate signal CIT0 is output. The switch SW is a two-input one-output switch. One input port of the switch SW is connected to an output port of the delay circuit D2, and the other input port to an output port of the delay circuit D1. The delay circuit D2 is so formed as to generate a delay equivalent to the amount of signal delay in the DLL circuit 23. If the above-described mode signal DLLdis indicates that the DLL circuit 23 is not used, the switch SW outputs an output signal of the delay circuit D1 as the input gate signal CIT0. If the mode signal DLLdis indicates that the DLL circuit 23 is used, the switch SW outputs an output signal of the delay circuit D2 as the input gate signal CIT0. Although not shown in FIG. 12, the delay circuits 200-1 to 200-7 have the same circuit configuration as the delay circuit 200-0.

As shown in FIG. 12, both the delay circuits D1 and D2 are so formed as to operate on the internal voltage VPERI. The same is true for the switch SW. Therefore, the amount of signal delay in the delay circuit 200 is not affected by a change in the external voltage VDD.

The input gate signals CIT0 to CIT7, which is delayed by the delay circuit unit 200, become signals that are obtained by delaying the output gate signals COT0 to COT7 by a predetermined period of time, as shown in FIG. 11.

To the command signal latch unit 300, an internal read command MDRDT is supplied in addition to the above-described output gate signals COT0 to COT7 and input gate signals CIT0 to CIT7. The command signal latch unit 300 is so formed as to accept, when the internal read command MDRDT is supplied, the internal read command MDRDT in synchronization with the input gate signal that is activated at the time, as shown in FIG. 11. In the example shown in FIG. 11, the command signal latch unit 300 accepts the internal read command MDRDT in synchronization with the input gate signal CIT0.

Incidentally, even though not shown in FIG. 10, the internal read command MDRDT is so formed as to pass through a delay circuit similar to the above-described delay circuit D2 before being accepted by the command signal latch unit 300. However, if the mode signal DLLdis indicates that the DLL circuit 23 is not used, the delay circuit is skipped, thereby preventing a difference in timing between the internal read command MDRDT and the input gate signal CIT0 to CIT7.

The output gate signals COT0 to COT7 and the input gate signals CIT0 to CIT7 are associated with one another in advance on a one-to-one basis. FIG. 11 shows an example in which the input gate signals CIT0 to CIT7 are associated with the output gate signals COT7 and COT0 to COT6, respectively. The following provides an explanation using the example of FIG. 11: The command signal latch unit 300 starts activating an internal read command DRC, which is an output signal of the latency counter 55, at a time when the output gate signal COT7, which corresponds to the input gate signal CIT0 used for accepting the internal read command MDRDT, becomes activated; in response, a process of outputting read data from the FIFO circuit 75 starts, and read data DQ is output from the data input/output terminal 15 via the data input/output circuit 78.

As described above, the input gate signals CIT0 to CIT7 are signals that are generated based on the internal clock signal LCLKOEFT. The internal clock signal LCLKOEFT is generated by the DLL circuit 23, which is so formed as to operate on the internal voltage VPERI and includes no circuits operating on the external voltage VDD as described above. In addition, the latency counter 55 is so formed as to operate on the internal voltage VPERI, and includes no circuits operating on the external voltage VDD. Therefore, the phases of the input gate signals CIT0 to CIT7 are not affected by a change in the external voltage VDD. Similarly, the phase of the internal read command MDRDT is not affected by a change in the external voltage VDD. Therefore, in the semiconductor device 10, it is prevented to occur differences between the phases of the input gate signals CIT0 to CIT7 and the phase of the internal read command MDRDT due to a change in the external voltage VDD. That is, in the semiconductor device 10, a decline in the latch margin LM (FIG. 11) of the latency counter resulting from a change in the external voltage VDD is curbed.

Incidentally, more detailed configuration of the latency counter 55 is disclosed in US Patent Application Publication No. 2011/0058445 A1, the entire contents of which are incorporated herein by reference.

As described above, in the semiconductor device 10 of the present embodiment, the DLL circuit 23 includes no circuit that operate on the external voltage VDD, thereby preventing variation in the phase of the internal clock signal DCLKOEFT due to the variation in the external voltage VDD. As a result, a decline in the latch margin of the latency counter 55 resulting from the variation in the external voltage VDD is curbed.

In the data input/output circuit 78, the level shift circuits 520 are placed between the impedance control circuits 511 to 513 and the slew rate adjustment circuits 531 to 532. Therefore, it is possible to generate accurate internal clock signals LCLKOET and LCLKOEFT despite no circuits that operate on the external voltage VDD are provided in the DLL circuit 23, Turning to FIG. 13, the data processing system 800 includes a structure in which the following components are connected to each other via a system bus 810: a data processor 820 (controller); a DRAM 10, which is the semiconductor device 10 of the present embodiment; a storage device 840; an I/O device 850; and a ROM 860.

The data processor 820 includes a function of supplying external clock signals CK and /CK to the DRAM 10, and a function of receiving an output signal (read data DQ) of the data input/output circuit (FIG. 1) of the DRAM 10 and performing a process corresponding to the received read data DQ. More specifically, for example, the following can be used as the data processor 820: a microprocessor (MPU), a digital signal processor (DSP), and the like. Incidentally, the data processor 820 and the DRAM 10 may be connected to each other by a local bus, not via the system bus 810.

Figure 14:
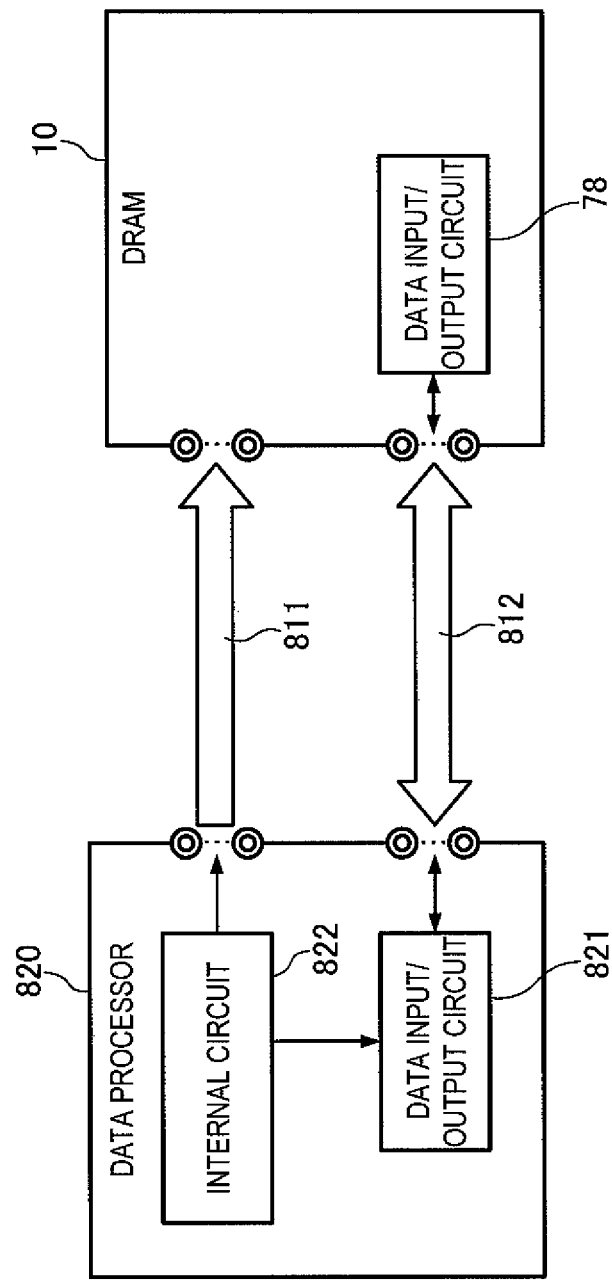
FIG. 14 is a block diagram showing how the data processor 820 and the DRAM 10 are connected.

As shown in FIG. 14, the data processor 820 and the DRAM 10 are connected to each other via a control bus 811 and a data bus 812, which each are part of the system bus 810. The control bus 811 is a line used for transferring control signals such as a clock, command, address, and the like from the data processor 820 to the DRAM 10. The data bus 812 is a line used for transferring data between the data processor 820 and the DRAM 10. The data are signals that are transmitted and received bi-directionally between the data processor 820 and the DRAM 10. Accordingly, as shown in FIG. 14, the data processor 820 also includes a data input/output circuit 821. In the above embodiment, the data input/output circuit 78 of the DRAM 10 has been described in detail. If an internal circuit 822 of the data processor 820 operates on an internal step-down voltage VPERIcon, the configuration of the data input/output circuit 821 can be the same as that of the data input/output circuit 78 of the DRAM 10.

As the storage device 840, a hard disk drive, an optical disc drive, a flash memory, or the like may be used. As the I/O device 850, a display device such as a liquid crystal display, an input device such as a keyboard and mouse, or the like may be used. Incidentally, the I/O device 850 may be either an input device or an output device.

Figure 13:
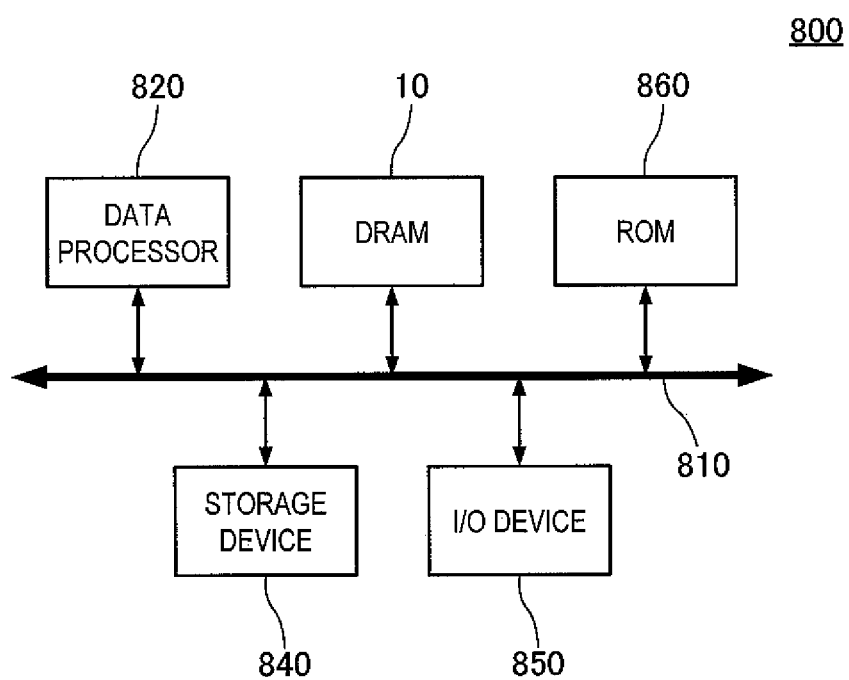
FIG. 13 is a block diagram showing the configuration of a data processing system 800 that uses the semiconductor device 10 of the present embodiment.

FIG. 13 shows only one system bus 810 for ease of explanation. However, a plurality of system buses 810 may be provided in a serial or parallel manner via a connector or the like, if necessary. The storage device 840, the I/O device 850, and the ROM 860 are not necessarily essential components. Furthermore, in FIG. 13, for ease of explanation, there is only one depicted per each type of component. However, the present invention is not limited to the above case. As for one, two, or more types of component, there may be provided more than one per type.

It is apparent that the present invention is not limited to the above embodiments, but may be modified and changed without departing from the scope and spirit of the invention.

For example, in the above embodiment, an example of the configuration of the latency counter 55 has been described in detail. However, the configuration of a latency counter of the present invention is not limited to that described above.

According to the above embodiment, the internal clock signal output from the DLL circuit 23 is divided into the following two types: the internal clock signal LCLKOET and the internal clock signal LCLKOEFT. However, one internal clock signal LCLK may be substituted for the above two.

The above embodiment is explained on the assumption that the data input/output circuit 78 includes a plurality of unit buffers. However, the data input/output circuit 78 may have only one unit buffer.

What is claimed is:

1. A device comprising:
    an output terminal; and
    an output unit coupled to the output terminal, the output unit comprising;
        an output buffer coupled to the output terminal and operating on a first power supply voltage,
        a first control circuit operating on a second power supply voltage, receiving an impedance adjustment signal and a data signal and making the output buffer drive the output terminal to a first logic level designated by the data signal with impedance designated by the impedance adjustment signal, the second power supply voltage being smaller in voltage level than the first power supply voltage, and
        a level shifter coupled between the output buffer and the first control circuit, the level shifter including a first circuit portion operating on the second power supply voltage and a second circuit portion operating on the first power supply voltage.

2. The device as claimed in claim 1, further comprising:
    first and second power supply terminals each externally supplied with the first power supply voltage, the first power supply terminal being coupled to the output buffer, the second power supply terminal coupled to the second circuit portion of the level shift circuit; and
    a voltage generation circuit generating the second power supply voltage.

3. The device as claimed in claim 2, wherein the voltage generation circuit receives the first power supply voltage from the second power supply terminal and generates the second power supply voltage in response to the first power supply voltage supplied from the second power supply terminal.

4. The device as claimed in claim 2, wherein the voltage generation circuit includes a voltage regulator circuit.

5. The device as claimed in claim 1, wherein the level shifter includes an input node coupled to the first control circuit and an output node coupled to the output buffer, the first circuit portion is coupled to the input node and the second circuit portion is coupled between the first circuit portion and the output node.

6. The device as claimed in claim 1, further comprises a second control circuit coupled between the level shifter and the output buffer, operating on the first power supply voltage and adjusting slew rate at which the output buffer drives the output terminal.

7. The device as claimed in claim 6, further comprising:
first and second power supply terminals each externally supplied with the first power supply voltage, the first power supply terminal being coupled to the output buffer, the second power supply terminal coupled to the second control circuit and the second circuit portion of the level shift circuit; and
a voltage generation circuit generating the second power supply voltage.

8. The device as claimed in claim 7, wherein the voltage generation circuit receives the first power supply voltage from the second power supply terminal and generates the second power supply voltage in response to the first power supply voltage supplied from the second power supply terminal.

9. The device as claimed in claim 7, wherein the voltage generation circuit includes a voltage regulator circuit.

10. The device as claimed in claim 6, wherein the level shifter includes an input node coupled to the first control circuit and an output node coupled to the second control circuit, the first circuit portion is coupled to the input node and the second circuit portion is coupled between the first circuit portion and the output node.

11. A device comprising:
an output terminal;
an output buffer including a power supply node supplied with a first power supply voltage and a plurality of transistors coupled in parallel between the power supply node and the output terminal;
a first control circuit operating on a second power supply voltage, receiving an impedance adjustment signal and a data signal and making one or ones of the transistors, that designated by the impedance adjustment signal, conductive to drive the output terminal to a first logic level designated by the data signal, the second power supply voltage being smaller in level than the first power supply voltage; and
a plurality of level shift circuits each coupled between the first control circuit and a control electrode of an associated one of the transistors, each of the level shift circuits including a first circuit portion operating on the second power supply voltage and a second circuit portion operating on the first power supply voltage.

12. The device as claimed in claim 11, further comprising:
first and second power supply terminals each externally supplied with the first power supply voltage, the first power supply terminal being coupled to the power supply node, the second power supply terminal coupled to the second circuit portion of the level shift circuit; and
a voltage generation circuit generating the second power supply voltage.

13. The device as claimed in claim 12, wherein the voltage generation circuit receives the first power supply voltage from the second power supply terminal and generates the second power supply voltage in response to the first power supply voltage supplied from the second power supply terminal.

14. The device as claimed in claim 12, wherein the voltage generation circuit includes a voltage regulator circuit.

15. The device as claimed in claim 11, wherein each of the level shifter circuit includes an input node coupled to the first control circuit and an output node coupled to the control electrode of the associated one of the transistors, the first circuit portion is coupled, in each of the level sift circuits, to the input node and the second circuit portion is coupled, in each of the level shift circuit, between the first circuit portion and the output node.

16. The device as claimed in claim 11, further comprising a second control circuit coupled between the level shift circuits and the control electrode of the transistors, operating on the first power supply voltage and adjusting slew rate at which the one or ones of the transistors drive the output terminal.

17. The device as claimed in claim 16, further comprising:
first and second power supply terminals each externally supplied with the first power supply voltage, the first power supply terminal being coupled to the power supply node, the second power supply terminal coupled to the second circuit portion of the level shift circuit and the second control circuit; and
a voltage generation circuit generating the second power supply voltage.

18. The device as claimed in claim 17, wherein the voltage generation circuit receives the first power supply voltage from the second power supply terminal and generates the second power supply voltage in response to the first power supply voltage supplied from the second power supply terminal.

19. The device as claimed in claim 17, wherein the voltage generation circuit includes a voltage regulator circuit.

20. The device as claimed in claim 16, wherein each of the level shift circuits includes an input node coupled to the first control circuit and an output node coupled to the control electrode of the associated one of the transistors, the first circuit portion is coupled, in each of the level sift circuits, to the input node and the second circuit portion is coupled, in each of the level shift circuit, between the first circuit portion and the output node.

* * * * *